US010938369B1

(12) United States Patent
Gradinaru

(10) Patent No.: US 10,938,369 B1
(45) Date of Patent: Mar. 2, 2021

(54) FRONT-END CIRCUITRY FOR COEXISTENCE OF TWO RADIOS SHARING AN ANTENNA AND A FREQUENCY BAND

(71) Applicant: Amazon Technologies, Inc., Seattle, WA (US)

(72) Inventor: Adrian Gradinaru, San Jose, CA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 16/657,133

(22) Filed: Oct. 18, 2019

(51) Int. Cl.
| | |
|---|---|
| *H04B 1/44* | (2006.01) |
| *H03H 7/18* | (2006.01) |
| *H01P 5/18* | (2006.01) |
| *H04B 17/10* | (2015.01) |
| *H01Q 3/38* | (2006.01) |
| *H04B 17/318* | (2015.01) |

(52) U.S. Cl.
CPC ................. *H03H 7/18* (2013.01); *H01P 5/18* (2013.01); *H01Q 3/38* (2013.01); *H04B 1/44* (2013.01); *H04B 17/103* (2015.01); *H04B 17/318* (2015.01)

(58) Field of Classification Search
CPC ...... H03H 7/18; H04B 17/103; H04B 17/318; H04B 1/44; H01P 5/18; H01Q 3/38
USPC .......................................................... 455/78
See application file for complete search history.

(56) References Cited

U.S. PATENT DOCUMENTS

| | | | | |
|---|---|---|---|---|
| 9,831,899 | B1* | 11/2017 | Boghrat | H03F 3/245 |
| 2003/0210660 | A1* | 11/2003 | Wiberg | H04J 13/16 |
| | | | | 370/320 |
| 2008/0258981 | A1* | 10/2008 | Achour | H01Q 21/065 |
| | | | | 343/702 |
| 2017/0012680 | A1* | 1/2017 | Madey | G01S 13/12 |
| 2017/0063427 | A1* | 3/2017 | Lee | H04B 1/56 |
| 2017/0104274 | A1* | 4/2017 | Keniuk | H01Q 21/00 |
| 2017/0223663 | A1* | 8/2017 | Mizusawa | H04W 4/06 |
| 2017/0257789 | A1* | 9/2017 | Mizusawa | H04W 72/0446 |
| 2018/0242276 | A1* | 8/2018 | Patel | H04L 5/0048 |
| 2019/0260559 | A1* | 8/2019 | Wu | H04W 72/04 |
| 2019/0387578 | A1* | 12/2019 | Shrestha | H04W 72/14 |
| 2019/0393948 | A1* | 12/2019 | Zhao | H04B 7/0408 |
| 2020/0107274 | A1* | 4/2020 | Jadhav | H04W 52/367 |
| 2020/0137803 | A1* | 4/2020 | Fakoorian | H04L 5/0055 |
| 2020/0183642 | A1* | 6/2020 | Arachchi | G06F 3/165 |
| 2020/0275369 | A1* | 8/2020 | Foster | G06F 1/28 |

* cited by examiner

*Primary Examiner* — Kathy W Wang-Hurst
*Assistant Examiner* — Max Mathew
(74) *Attorney, Agent, or Firm* — Lowenstein Sandler LLP

(57) ABSTRACT

Technologies directed to sharing an antenna and a frequency band between coexistence radios are described herein. In one device, semi-active front-end circuitry includes a directional coupler and a phase-shifter circuit coupled to two radios that use the same antenna and the same frequency band. The phase-shifter circuit and directional coupler create an isolation null at an isolated port of the directional coupler that cancels a copy of an incident wave of a transmit signal being applied at an input port of the directional coupler. The isolation null permits the second radio to receive a receive signal concurrently with the first radio transmitting the transmit signal.

20 Claims, 18 Drawing Sheets

FRONT-END CIRCUITRY FOR COEXISTENCE OF TWO RADIOS SHARING AN ANTENNA AND A FREQUENCY BAND

BACKGROUND

A large and growing population of users is enjoying entertainment through the consumption of digital media items, such as music, movies, images, electronic books, and so on. The users employ various electronic devices to consume such media items. Among these electronic devices (referred to herein as endpoint devices, user devices, clients, client devices, or user equipment) are electronic book readers, cellular telephones, Personal Digital Assistants (PDAs), portable media players, tablet computers, netbooks, laptops, and the like. These electronic devices wirelessly communicate with a communications infrastructure to enable the consumption of the digital media items. In order to communicate with other devices wirelessly, these electronic devices include one or more antennas.

BRIEF DESCRIPTION OF DRAWINGS

The present inventions will be understood more fully from the detailed description given below and from the accompanying drawings of various embodiments of the present invention, which, however, should not be taken to limit the present invention to the specific embodiments, but are for explanation and understanding only.

DETAILED DESCRIPTION

Figure 1:
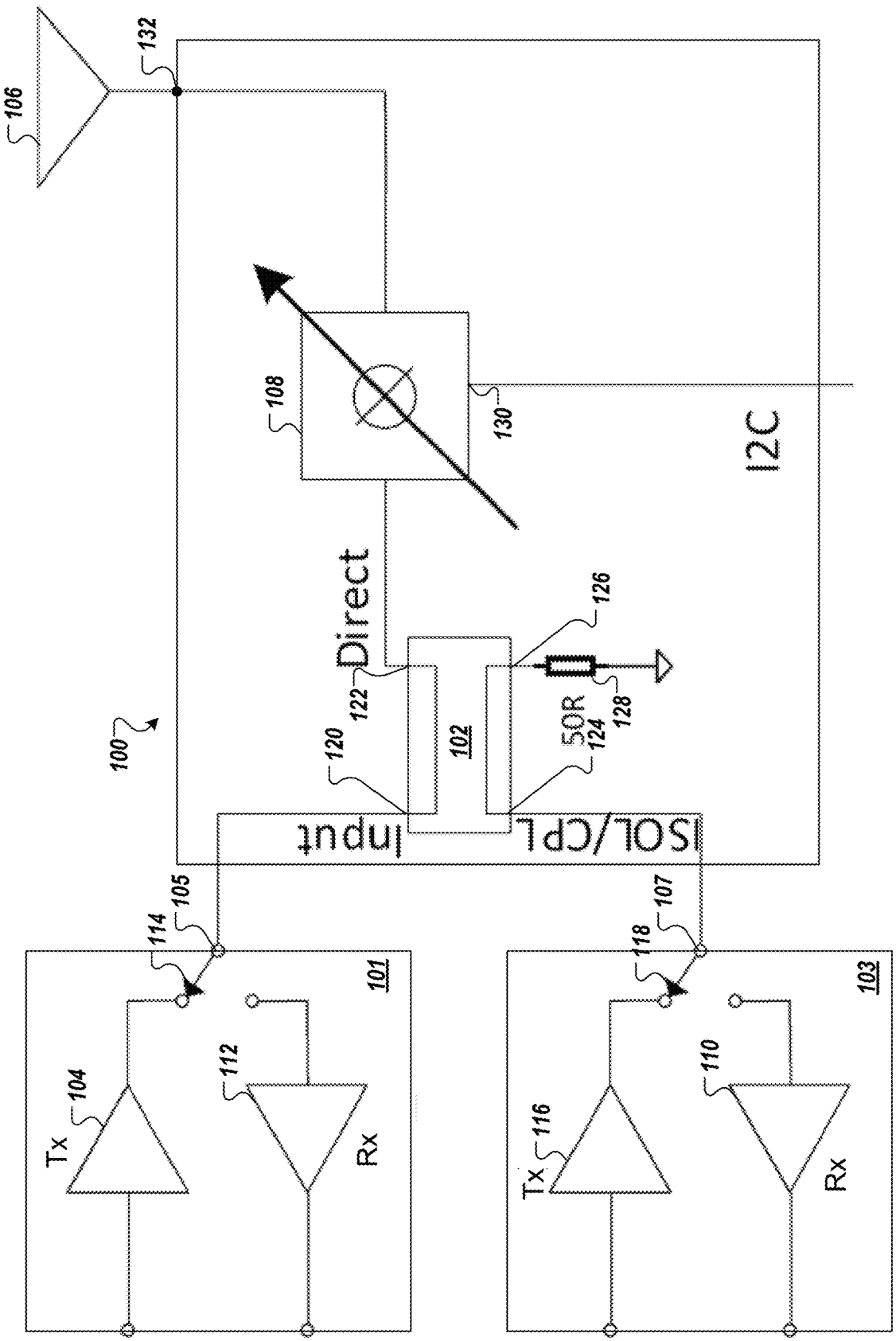
FIG. 1 is a block diagram of front-end circuitry coupled to two radios and a single antenna according to one embodiment.

Technologies directed to sharing an antenna and a frequency band between coexistence radios are described herein. In one device, Radio Frequency (RF) front-end circuitry includes a directional coupler (also referred to herein as "coupler") and a phase-shifter circuit coupled to two radios that use the same antenna and the same frequency band. The phase-shifter circuit and directional coupler create an isolation null at an isolated port of the directional coupler that cancels a copy of an incident wave of a Transmit (TX) signal being applied at an isolated port of the directional coupler. The isolation null permits the second radio to receive a Receive (RX) signal concurrently with the first radio transmitting the TX signal.

Various communication standards operate within the same frequency spectrum that causes problems for devices with coexistence radios that share the same frequency band. Coexistence refers to the functioning of different wireless technologies/standards in the same frequency band. For example, various wireless technologies operate in the 2.4 GHz unlicensed Industrial-Scientific-Medical (ISM) frequency band, such as IEEE 802.11 wireless standards (e.g., Wi-Fi® technologies), IEEE 802.15.4 wireless standard for wireless sensor networks, Wireless Personal Area Networks (WPAN) (e.g., the Bluetooth® technologies), or the like. New applications, like Internet-of-Things (IoT) wireless devices and Machine-to-Machine (M2M) devices add the crowded frequency spectrum. Coexistence of multiple radios can cause interference between each other and can disrupt operation when operating in the same frequency band. Interference can also result in loss of data, reduction in signal quality, poor wireless connections, decreased bandwidth, decreased operating range, or the like. Multiple radios need to operate within the same or closely spaced frequencies without interfering with each other.

Aspects of the present disclosure provide a solution for coexistence of two or more radios sharing an antenna and a frequency band. In one implementation, a RF front-end circuitry with a coupler and a phase shifter permits concurrent operations of two radios sharing an antenna and a frequency band. An input port of the directional coupler is coupled to a first radio operating with a first wireless technology and an isolated port of the directional coupler is coupled to a second radio operating with a second wireless technology. An antenna port of the directional coupler is coupled, through a phase shifter, to a single antenna that is shared by the first radio and the second radio. During operation, an incident wave is applied at the input port of the directional coupler and, due to the finite directivity of the directional coupler, an incident voltage phasor with a similar phase but lower amplitude will appear at the isolated port of the directional coupler. The incident wave propagates through the directional coupler and arrives at the antenna port of the directional coupler. A reflected wave, caused by a combination of mismatched antenna load and the phase shifter, undergoes a 90-degrees (90°) phase shift when reflected at the antenna port. The reflected wave also undergoes a further 90° phase shift, travelling through the directional coupler to the isolated port, creating a deep isolation null (maximum isolation) at the isolated port. The creation of the isolation null cancels the phasor at the isolated port caused by the incident wave applied at the input port. This permits incoming signals to be received by the second radio at the isolated port without interference from the TX incident wave applied to the input port by the first radio.

FIG. 1 is a block diagram of front-end circuitry 100 coupled to two radios 101, 103 and a single antenna 106 according to one embodiment. A first radio 101 includes a first transmitter 104 and a first receiver 112 each coupled to a first switch 114, which is coupled to a first terminal 105. A second radio 103 includes a second transmitter 116 and a second receiver 110 each coupled to a second switch 118, which is coupled to a second terminal 107. The front-end circuit 100 includes a directional coupler 102 and a phase-shifter circuit 108. The directional coupler 102 includes four ports: an input port 120, a direct (transmitted) antenna port 122, an isolated port 124, and a coupled port 126. The input port 120 is coupled to the first terminal 105 of the first radio 101. The isolated port 124 is coupled to the second terminal 107 of the second radio 103. The direct (transmitted) port 122 is coupled to the phase-shifter circuit 108 and the antenna 106 is coupled to an antenna port 132 that is coupled to the phase-shifter circuit 108. The phase-shifter circuit 108 includes the antenna port 132 that is coupled to the antenna 106 and another port coupled to the direct (transmitted) port 122 of the directional coupler 102. The coupled port 126 is terminated with an impedance matched load 128 (e.g., 50-Ohm resistive element, also referred to as a matched load). As described herein, the phase-shifter circuit 108 can be calibrated to cause a reflected wave at the direct port 122 to have a first 90-degrees phase shift from a phase of an incident wave applied at the input port 120. The reflected wave undergoes a second 90-degrees phase shift between the direct (transmitted) port 122 and the isolated port 124, canceling a copy of the incident wave that is present at the isolated port 124 as a result of the incident wave being applied to the input port 120. In one embodiment, the directional coupler 102 can be the "ACX CP1608-06A2450," developed by Advanced Ceramic X (ACX) Corp. Alternatively, the directional coupler 102 can be other types of couplers. It should be noted that the isolated port 124 is considered "an isolated port" with respect to a TX incident wave of the first radio 101. Port 124 is considered "a coupled port" with respect to a reflected wave at the port 122, caused by the combination of the phase shifter 108 and antenna 106.

The phase-shifter circuit 108 is coupled between the direct (transmitted) port 122 and the antenna 106. The phase-shifter circuit 108 can be controlled by a control signal 130. The phase-shifter circuit 108 can include a control input that receives the control signal 130. In one embodiment, the phase-shifter circuit 108 is a digital phase shifter, such as a Silicon-on-Insulator (SOI) digital phase shifter. In other embodiments, the phase-shifter circuit 108 can be an analog phase shifter (e.g., varactor diodes that change capacitance with voltage, nonlinear dielectrics, or the like). The phase-shifter circuit 108 can be used to change a transmission phase angle of a two-port network. The phase-shifter circuit 108 can provide a low insertion loss in all phase states. The phase-shifter circuit 108 is bidirectional, providing phase shifts to signals passing through the phase-shifter circuit 108 in either direction. The phase-shifter circuit 108 can be controlled electrically, magnetically, mechanically, or the like. In one implementation, the phase-shifter circuit 108 is an electronically-controlled, passive reciprocal network phase shifter. This results in the front-end circuitry 100 being considered "semi-active," since the phase-shifter circuit 108 is controlled to set the phase being applied. In contrast, passive front-end circuitry would not be controlled and an Active Interference Cancelation (AIC) front-end circuitry that does more than just controlling a phase shifter. For example, one conventional AIC front-end circuitry generates a copy of a signal being transmitted by a first radio and processes (e.g., delay and phase shifts) the copy of the signal in order to remove this signal from an incoming signal for a second radio. The front-end circuitry 100 is less complex than conventional AIC front-end circuitry and the front-end circuitry 100 can consume less power than the conventional AIC front-end circuitry. In some embodiments, the front-end circuitry 100 is considered semi-active and, in other embodiments, the front-end circuitry 100 is considered active when the phase shifter is an analog phase shifter that is actually considered active.

When the phase-shifter circuit 108 is a digital phase shifter, the digital phase shifter can have multiple states with different insertion phases. Unlike an analog phase shifter that is controlled by a continuous variable signal (e.g., typically a voltage signal) of the control signal 130, the digital phase shifter is controlled by digital bits of the control signal 130. The digital phase shifter can be more immune to noise on the voltage control lines than the analog phase shifter. The digital phase shifter can provide a discrete set of phase states that are controlled by phase bits in the control signal 130. For example, the phase bits of the control signal 130 can have a highest order bit corresponding to 180°, a next highest bit corresponding to 90°, then 45°, and so forth, dividing up 360° into smaller binary steps. For example, a 6-bit phase shifter would have a 5.6° least significant bit. In another embodiment, the digital phase shifter can be a 7-bit digital phase shifter on a SOI implementation. Alternatively, other types of digital phase shifters can be used, including N-bit digital phase shifter, where N is a positive integer. In one embodiment, the digital phase shifter has approximately 3.8 dB attenuation. Phase shift steps of the digital phase shifter can be used to compensate for any phase change due to antenna load change. In one implementation, a phase shift step of 2.8° can be used to compensate for any phase change due to the antenna load change. In one embodiment, the phase-shifter circuit 108 receives the control signal 130 over an interface, such as an I2C interface (also referred to I$^2$C interface). The I$^2$C interface is a synchronous, multi-master, multi-slave, packet switched, single-ended, serial computer bus developed by Phillips Semiconductor. The first radio 101, the second radio 103, or a separate processing device (e.g., a System on Chip (SoC)) can include an I$^2$C interface that couples to the phase-shifter circuit 108 to provide the control signal 130.

Figure 3A:
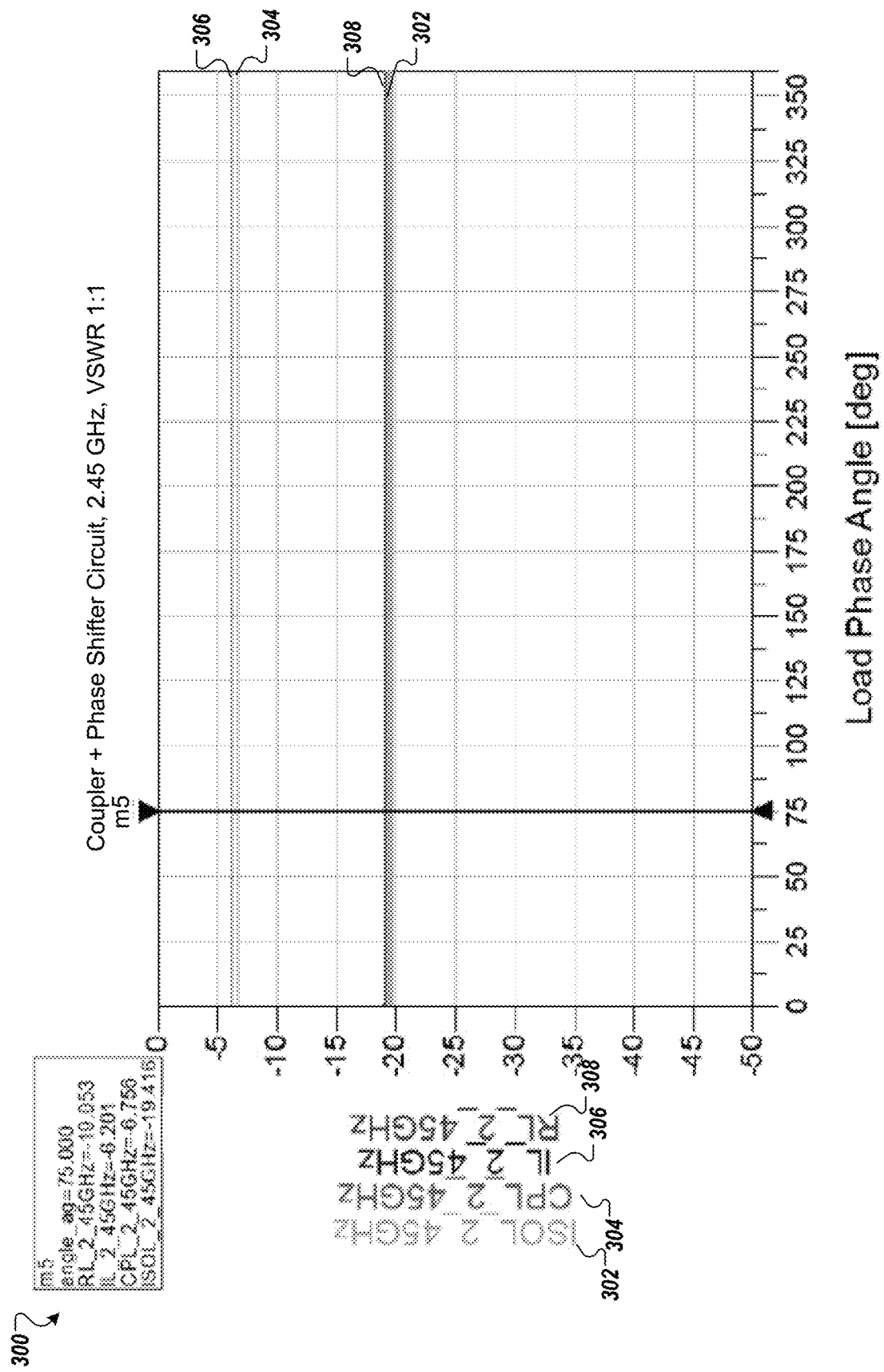
FIG. 3A is graph illustrating measured S-parameters of a directional coupler of the front-end circuitry of FIG. 1 with a Voltage Standing Wave Ratio (VSWR) of 1:1 at the antenna port according to one embodiment.
Figure 3B:
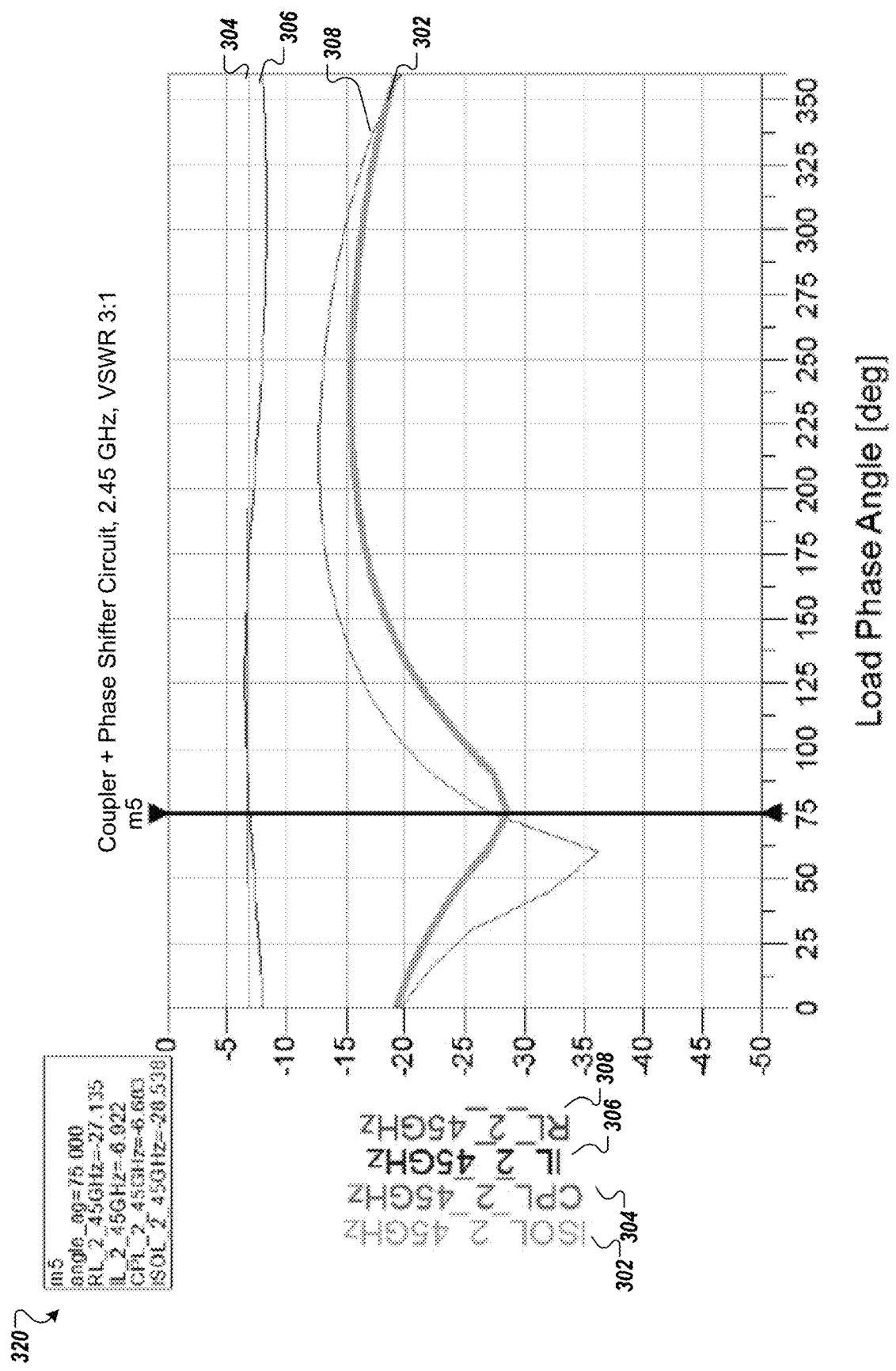
FIG. 3B is graph illustrating measured S-parameters of a directional coupler of the front-end circuitry of FIG. 1 with a VSWR of 3:1 and variable phase, at the antenna port according to one embodiment.
Figure 3C:
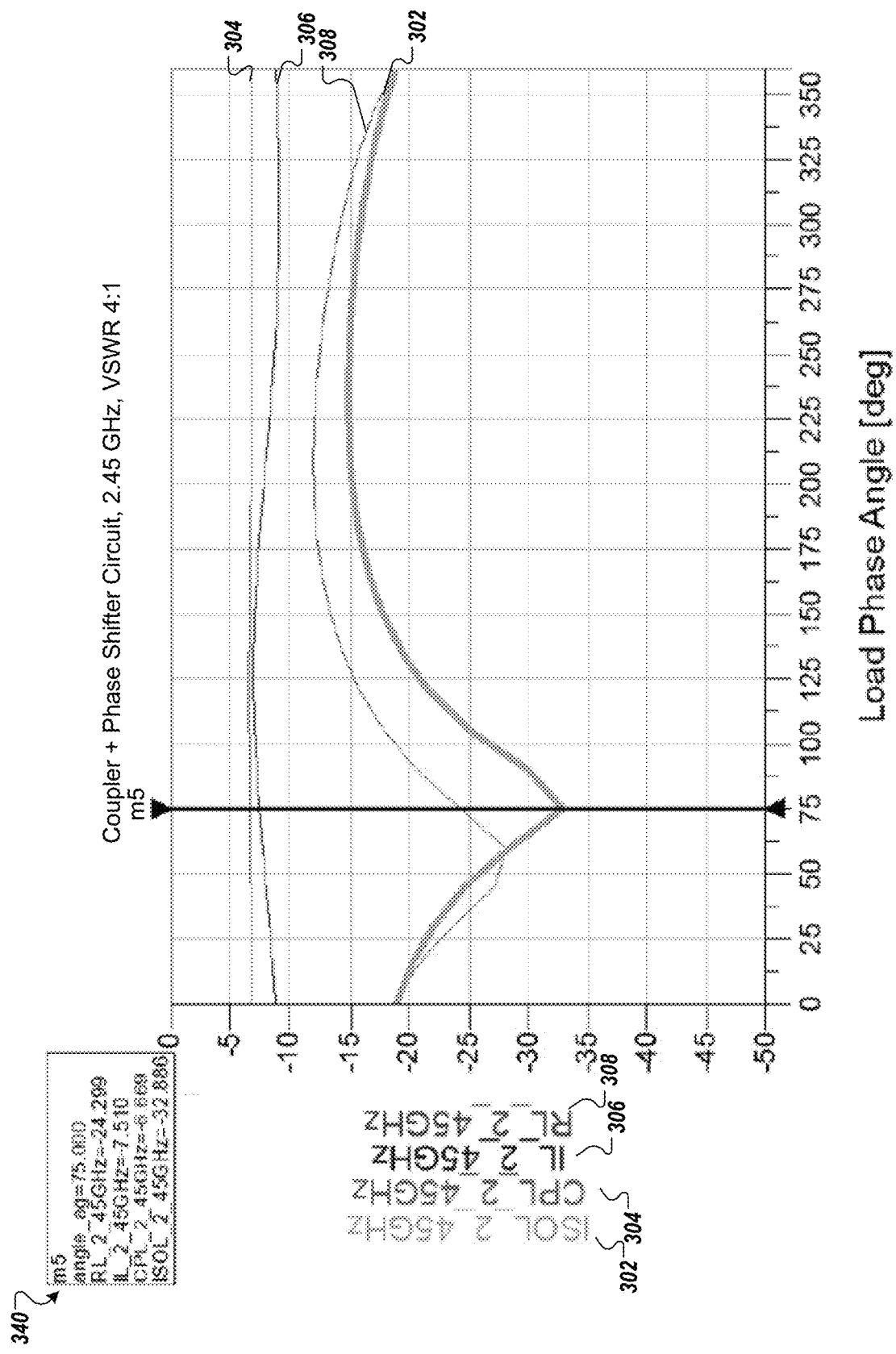
FIG. 3C is graph illustrating measured S-parameters of a directional coupler of the front-end circuitry of FIG. 1 with a VSWR of 4:1 and variable phase, at the antenna port according to one embodiment.

The phase-shifter circuit 108, when implemented as a digital phase shifter or an analog phase shifter, can provide some advantages. Two radios operating in the same band can share the same antenna. For example, the first radio 101 can implement the Bluetooth® technology and the second radio 103 can implement the ZigBee® technology. Using the directional coupler 102 and the phase-shifter circuit 108, the first radio 101 and the second radio 103 can share the same antenna, antenna 106, and can operate concurrently in the same frequency band, the 2.4 GHz ISM band. The phase-shifter circuit 108 also allows a 3 dB, or some other isolation coupler, coupler 102, to be integrated on the SOI substrate of a digital phase shifter. That is, a single integrated circuit can be used for the directional coupler 102 and the phase-shifter circuit 108. The single integrated circuit can be coupled to the first radio 101 and the second radio 103 and the antenna 106. The single integrated circuit can receive the control signal 130 from one of the first radio 101, the second radio 103, or from a separate controller, such as an application processor, a SoC, a host processor, or the like. Alternatively, the directional coupler 102 and the phase-shifter circuit 108 can be integrated into a single component. In another embodiment, the first radio 101, the second radio 103, and the front-end circuitry 100 can be implemented in other configurations. Adjusting phase using the phase-shifter circuit 108 will significantly increase isolation between 105 and 107. For example, the front-end circuitry 100 with the phase-shifter circuit 108 can achieve approximately −28.5 dB in VSWR at the 3:1 compared to −12 dB without phase adjustment. Isolation continues to improve as the antenna mismatch becomes more severe. For example, the front-end circuitry 100 with the phase-shifter circuit 108 can achieve approximately −32.8 dB in VSWR at the 4:1, between 105 and 107 (or 101 and 103). This isolation is robust for changes of conditions at the direct (transmitted) port of the directional coupler 102. Using the front-end circuitry 100 with the phase-shifter circuit 108, the second radio 103 (or the first radio 101 or a separate controller) can run isolation calibration. The isolation calibration would not require an Analog-to-Digital Conversion (ADC) or down conversion to find high isolation. The isolation calibration can include the second radio 103 listening for packets from the first radio 101 and the second radio 103 could adjust the phase-shifter circuit 108 via the control signal 130, such as by adjusting phase bits in the control signal 130 over the I²C interface, until a signal strength indicator (e.g., receive signal strength indicator (RSSI)) is at a minimum value. The minimum value can be a lowest signal strength indicator value that results from adjusting the phase shift amount. In another embodiment, the phase shift amount can be adjusted until the signal strength indicator value is below a threshold value. The threshold value can correspond to an acceptable interference level. Alternatively, the isolation calibration can be performed by other components. By the phase of the phase-shifter circuit 108 being programmable, the front-end circuitry 100 can maintain the isolation between the first radio 101 and the second radio 103. In some cases, the programmable phase of the phase-shifter circuit 108 can permit the front-end circuitry 100 to increase isolation to a substantial degree. For example, as shown and described below with respect to FIGS. 3A-3C, if the phase is adjusted using a simple calibration, the isolation becomes approximately −28.5 dB in VSWR 3:1 and approximately −32.8 dB in VSWR 4:1. The higher the antenna mismatch, the higher the isolation becomes, leading to a robust design. It should be noted that the "phase of the phase-shifter circuit" corresponds to a phase shift amount of phase that is applied to the reflected wave. In one embodiment, a processor is coupled to the first radio and the second radio. The processor sends a control signal to the phase-shifter circuit 108. The control signal adjust a first phase shift amount applied by the phase-shifter circuit 108 to the reflected wave to a second phase shift amount applied by the phase-shifter circuit to the reflected wave such at the reflected wave at the direct (transmitted) port 122 has a first 90-degrees phase shift. As described herein, the reflected wave undergoes a second 90-degrees phase shift through the directional coupler 102, canceling a copy of the incident wave that is present at the isolated port 124 as a result of the incident wave being applied to the input port 120. It should be noted that there can be small errors present in the system such that the 90-degrees phase shifts may not be exactly 90 degrees. Also, when using a digital phase shifter only discrete only discrete phase steps are available. A 7-bit discrete phase shifter will have a Least Significant Bit (LSB) of 2.7 degree. So, the result of the calibration can be a first phase shift of 87.3 degrees. The wave traveling through the coupler from 122 to 124 may undergo a second not-exactly 90-degree phase shift, be that 88 degrees for example. Instead of the first and second phase shift adding up to 180 degree precisely, the small errors mentioned will create a sum of 87.3+88=175.3 degrees. This only means that the cancellation will not be perfect, yet still very significant. FIG. 3A-C have these errors included.

In another embodiment, the second radio 103 can measure a first signal strength indicator value of a first signal transmitted by the first radio 101 while the phase-shifter circuit 108 is set to apply a first phase shift amount to the reflected wave. The second radio 103 sends a control signal to the phase-shifter circuit 108 to change the first phase shift amount to a second phase shift amount. The second radio 103 can measure a second signal strength indicator value of a second signal transmitted by the first radio 101 while the phase-shifter circuit 108 is set to apply the second phase shift amount to the reflected wave. The second signal strength indicator value is less than the first signal strength indicator value. The second phase shift amount applied to the reflected wave by the phase-shifter circuit results in the reflected wave at the direct port 122 having the first 90-degrees phase shift. In another embodiment, the second radio 103 performs an isolation calibration process in which the second radio listens for packets transmitted by the first radio 101. The second radio adjusts, via a control signal sent from the second radio 103 to the phase-shifter circuit 108, a phase shift amount applied by the phase-shifter circuit 108 until a signal strength indicator value of the packets is a minimum value or below a specified value. The minimum value can be a lowest signal strength indicator value that results from adjusting the phase shift amount. In another embodiment, the phase shift amount can be adjusted until the signal strength indicator value is below a threshold value. The threshold value can correspond to an acceptable interference level. It should be noted that the desired phase of the reflected signal going back into the directional coupler should be 90 degrees, as the reflected signal undergoes another 90-degrees shift from the directional coupler to obtain a desired 180-degrees phase shift from the incident wave being applied to the input port. That is, a first phase shift amount being applied by the phase-shifter circuit and the phase shift caused by the impedance mismatch, can result in an arbitrary phase that is not the desired 90 degrees. Thus, the calibration of the phase-shifter circuit can be performed to determine a second phase shift amount that can be applied by the phase-shifter circuit to obtain the desired phase of 90 degrees for the reflected signal going back into the directional coupler so that the additional 90-degrees phase shift, caused by the directional coupler, results in 180-degrees phase shift from the incident wave being applied at the input port (e.g., a TX signal). The 180-degrees phase shift results in cancelation of interference at the isolated port caused by the incident wave being applied at the input port (e.g., TX), allowing the second radio to receive a RX signal on the isolated port. For example, the antenna mismatch can result in 35-degrees phase shift in the reflected signal and a first phase shift amount is initially set to 65 degrees. The total shift of the reflected signal going back into the directional coupler would be 100 degrees, not 90 degrees. The reflected signal undergoes another 90-degrees phase shift through the directional coupler, resulting in a total phase shift of 190 degrees at the isolated port. Calibration can be performed to obtain the desired 180 degrees at the isolated port by determining that a second phase shift amount should be set to 55 degrees. By applying 55 degrees by the phase-shifter circuit, the total phase shift of the reflected signal going back into the directional coupler would be 90 degrees post calibration. The reflected signal undergoes the second 90-degrees phase shift through the directional coupler, resulting in a total phase shift of 180 degrees at the isolated port. Additional details of the operation of the front-end circuitry 100 with the phase-shifter circuit 108 are described below with respect to FIG. 2.

In another embodiment, the directional coupler receives an incident wave at the first port having a first phase. The phase-shifter circuit causes a first reflected wave at the third port to have a second phase that is 90-degrees from the first phase. The directional coupler outputs a second reflected wave, at the second port, that has a third phase that is 180-degrees from the first phase of the incident wave. The second reflected wave cancels a copy of the incident wave at the second port.

Figure 2:
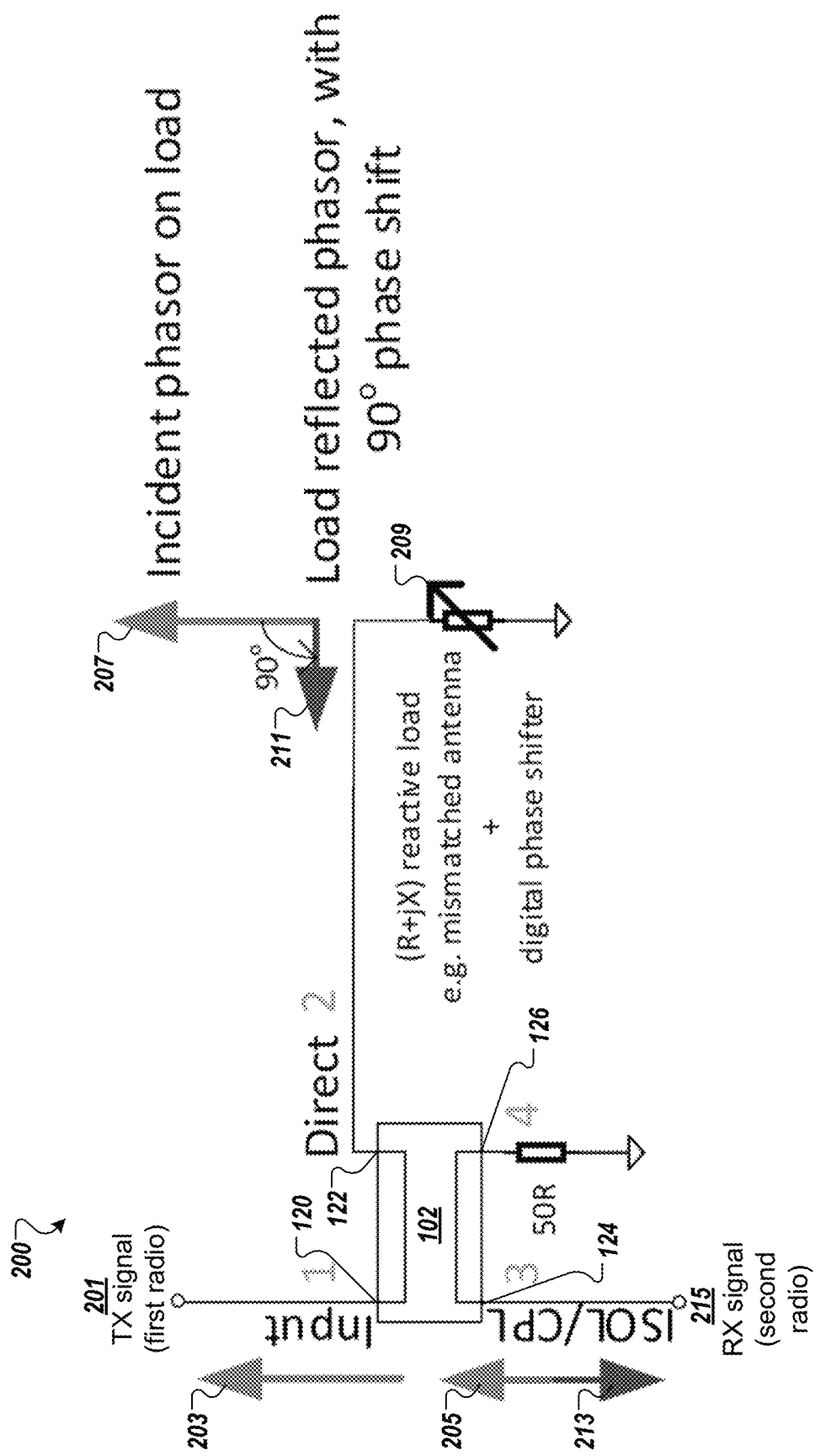
FIG. 2 is a block diagram that illustrates a principle of operation for creating a maximum isolation condition using the front-end circuitry of FIG. 1 according to one embodiment.

FIG. 2 is a block diagram that illustrates a principle of operation for creating a maximum isolation condition 200 using the front-end circuitry 100 of FIG. 1 according to one embodiment. The first radio 101 applies a TX signal 201 at the input port 120 of the directional coupler 102, creating an incident wave, depicted as the voltage phase 203, at the input port 120. Due to the finite directivity of the directional coupler 102, a voltage phasor 205 with a similar phase but lower amplitude will appear at the isolated port 124 of the directional coupler 102. The incident wave propagates through the directional coupler 102 and arrives at the direct (transmitted) port 122 of the directional coupler 102 as an incident phasor 207 on a load 209. The load 209 is a reactive load that is caused by a combination of mismatched antenna load and the phase-shifter circuit 108. The incident phasor 207 also has almost the same phase as the incident wave 203 at the input port 120. A reflected wave 211, caused by the combination of mismatched antenna load and the phase-shifter circuit 108, while the phase-shifter circuit had its phase state to achieve maximum isolation at the isolated port 124, undergoes a 90° phase shift when reflected at the load. It should be noted that the reason the wave is reflected with 90 degrees off the antenna load+phase shifter combination, is the fact that the phase programmability in the phase shifter has been adjusted through a calibration process until achieving the 90 degrees reflected. This is the essence of using the phase shifter and calibrating the phase shifter to find phase for compounded 90 degrees reflected. Without the programmable phase shifter the reflected wave can have any phase at all, say 36 degree. Traveling back through the directional coupler to the isolated port 124 the total phase will be 90+36=126 degree for phasor 213. In this case, the phasor 213 would not cancel the phasor 205 (180 degrees out of phase are required) and the isolation will not be nulled. The reflected wave 211 also undergoes a further 90° phase shift, travelling through the directional coupler 102 to the isolated port 124, creating a deep isolation null when phasor 213 will cancel (add with 180 degrees out of phase to) phasor 205 (maximum isolation condition 200) at the isolated port 124. The creation of the isolation null or maximum isolation condition 200 is realized through canceling the phasor 205 at the isolated port 124 caused by the incident wave 203 being applied at the input port 120. Because phasor 213 cancels the phasor 205 caused by the TX signal 201 from the first radio 101, the second radio 103 is able to receive a RX signal 215 at the isolated port 124 that does not have interference (or has reduced interference) from the TX signal 201. That is, the isolation null makes it so the incident wave 203 does not interfere with incoming RX signals received by the second radio 103 via the same antenna 106.

In one implementation, the first radio 101 implements the Wi-Fi® technology and the transmitter is transmitting the TX signal 201. The second radio 103 implements the Bluetooth® technology and the receiver is receiving the RX signal 215. The antenna 106 is a single antenna that is being shared by the first radio 101 and the second radio 103. The Wi-Fi® and Bluetooth® technologies share the same 2.4 GHz ISM band. The first radio 101 and the second radio 103 can be part of a TV dongle, for example, where there is a small form factor, and a single antenna is used for both radios. The first radio 101 and the second radio 103 can be part of a voice-controlled device. The front-end circuitry 100 can isolate the Bluetooth® receiver (second radio) from the Wi-Fi® transmitter. Similarly, the first radio 101 can implement the Bluetooth® technology and the second radio 103 can implement the ZigBee® technology and the front-end circuitry 100 can isolate the transmitters from the receivers of these respective radios that share the same frequency band and the same antenna 106. As described herein, by programming the phase of the front-end circuitry 100, the isolation between the two radios (i.e., a transmitter of one radio and a receiver of the other radio) can be maintained and increased to a substantial degree. For example, the phase-shifter circuit 108 can be used to program the phase of the front-end circuitry 100 to maintain and increase isolation between the first radio 101 and the second radio 103, such as illustrated in FIG. 1. Alternatively, other configurations are possible to control the phase of the front-end circuitry 100 to generate the isolation null (maximum isolation condition 200) at the isolated port 124 to cancel out any effects from the transmitting radio. The phase can be adjusted using a simple calibration. As illustrated and described below with respect to FIG. 3A-3C, the front-end circuitry 100 can maintain or increase isolation between the two radios.

FIG. 3A is graph 300 illustrating measured S-parameters of a coupler 102 of the front-end circuitry 100 of FIG. 1 with a VSWR of 1:1 at the antenna port according to one embodiment. The measured S-parameters include isolation loss (ISOL) 302, coupled loss (CPL) 304, insertion loss (IL) 306, and return loss (RL) 308. The S-parameter results of the front-end circuitry 100 of FIG. 1 have been obtained by combining the measured S-parameters for the directional coupler 102 (e.g., ACX CP1608-06A2450) and the measured S-parameters for the phase-shifter circuit 108. As shown in graph 300, the ISOL 302 is approximately −19.416 dB, the CPL 304 is approximately −6.756 dB, the IL 306 is approximately −6.201 dB, and the RL 308 is approximately −19.053 dB. It should be noted that the measured S-parameters are measured with VSWR being 1:1, which may not reflect actual conditions due to the mismatched antenna and phase-shifter circuit 108. The following graphs illustrate the same measured S-parameters at 3:1 and 4:1 VSWR.

FIG. 3B is graph 320 illustrating measured S-parameters of a coupler of the front-end circuitry of FIG. 1 with a VSWR of 3:1 and variable phase at the antenna port according to one embodiment. As shown in graph 320, the ISOL 302, the CPL 304, the IL 306, and the RL 308 all vary as a function of the load phase angle. For example, at load phase angle of 75°, the ISOL 302 is approximately −28.538 dB, the CPL 304 is approximately −6.683 dB, the IL 306 is approximately −6.922 dB, and the RL 308 is approximately −27.135 dB.

FIG. 3C is graph illustrating measured S-parameters of a coupler of the front-end circuitry of FIG. 1 with a VSWR of 4:1 and variable phase at the antenna port according to one embodiment. As shown in graph 340, the ISOL 302, the CPL 304, the IL 306, and the RL 308 all vary as a function of the load phase angle. For example, at load phase angle of 75°, the ISOL 302 is approximately −32.886 dB, the CPL 304 is approximately −6.669 dB, the IL 306 is approximately −7.510 dB, and the RL 308 is approximately −24.299 dB.

As illustrated and described with respect to FIG. 3A-3C, using the front-end circuitry 100, the isolation becomes −28.5 dB in VSWR 3:1, as illustrated in FIG. 3B, and −32.8 dB in VSWR 4:1, as illustrated in FIG. 3C. As shown in FIG. 3A-3C, the higher the antenna mismatch, the higher the isolation will become, leading to a robust design, such as compared to front-end circuitry with a coupler and no phase-shifter circuit 108, such as described and illustrated below with respect to FIGS. 4, 5A-5C.

Figure 4:
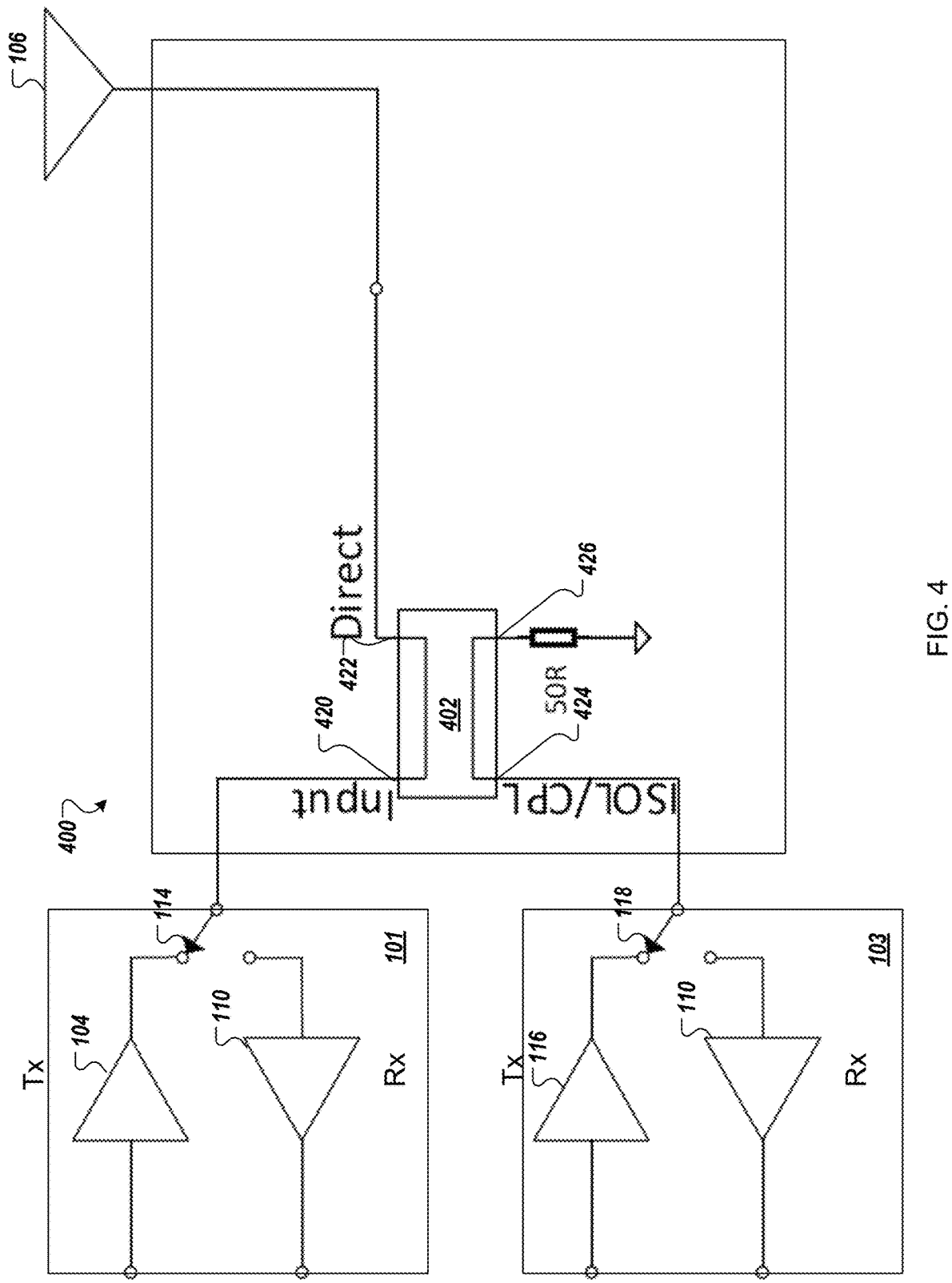
FIG. 4 is a block diagram of front-end circuitry coupled to two radios and a single antenna according to another embodiment.

FIG. 4 is a block diagram of front-end circuitry 400 coupled to two radios and a single antenna according to another embodiment. The front-end circuitry 400 is similar to the front-end circuitry 100, except the front-end circuitry 400 includes a coupler 402 and does not include the phase-shifter circuit 108. The coupler 402, similar to the directional coupler 102, includes an input port 420, an antenna port 422 that is directly coupled to the antenna 106, an isolated port 424, and a coupled port 426. It should be noted that the isolated port 424 is considered "an isolated port" to second radio 103 when a TX wave of the first radio 101 is present at port 420, but is considered "a coupled port" with respect to a reflected wave at antenna 106, when present at 422 port.

Figure 5A:
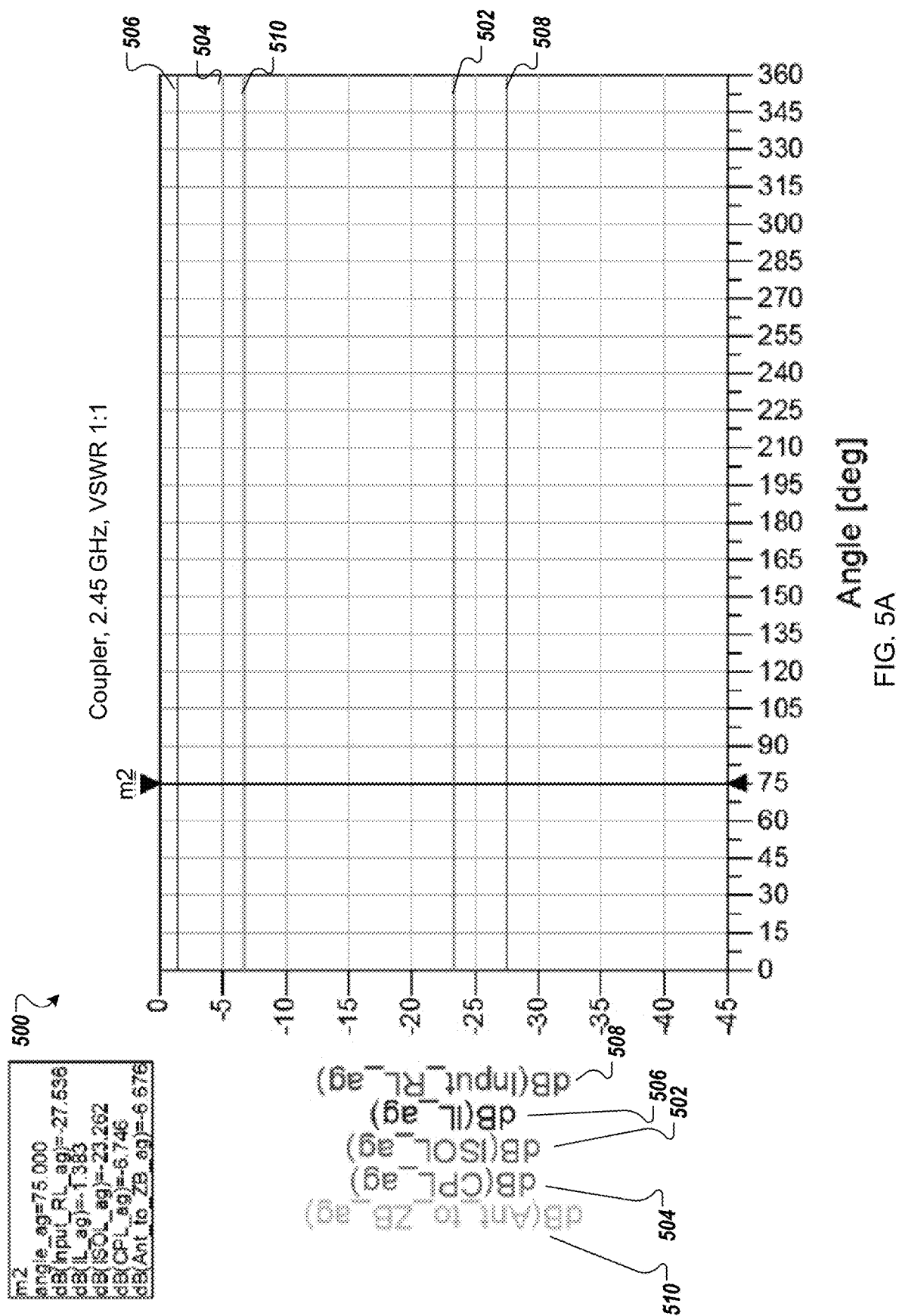
FIG. 5A is graph illustrating measured S-parameters of a directional coupler of the front-end circuitry of FIG. 4 with a VSWR of 1:1 at the antenna port according to one embodiment.
Figure 5B:
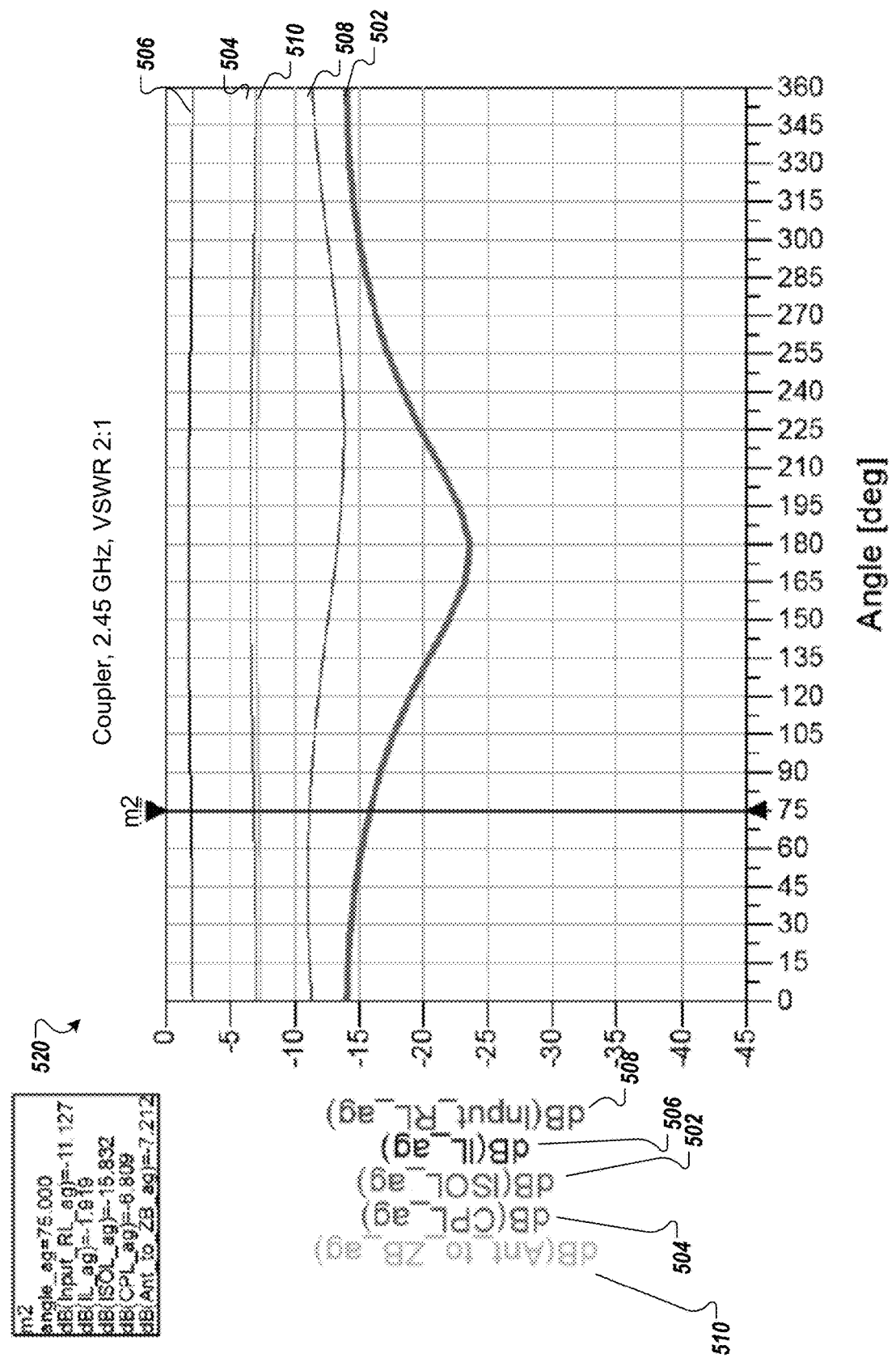
FIG. 5B is graph illustrating measured S-parameters of a directional coupler of the front-end circuitry of FIG. 4 with a VSWR of 2:1 and variable phase, at the antenna port according to one embodiment.
Figure 5C:
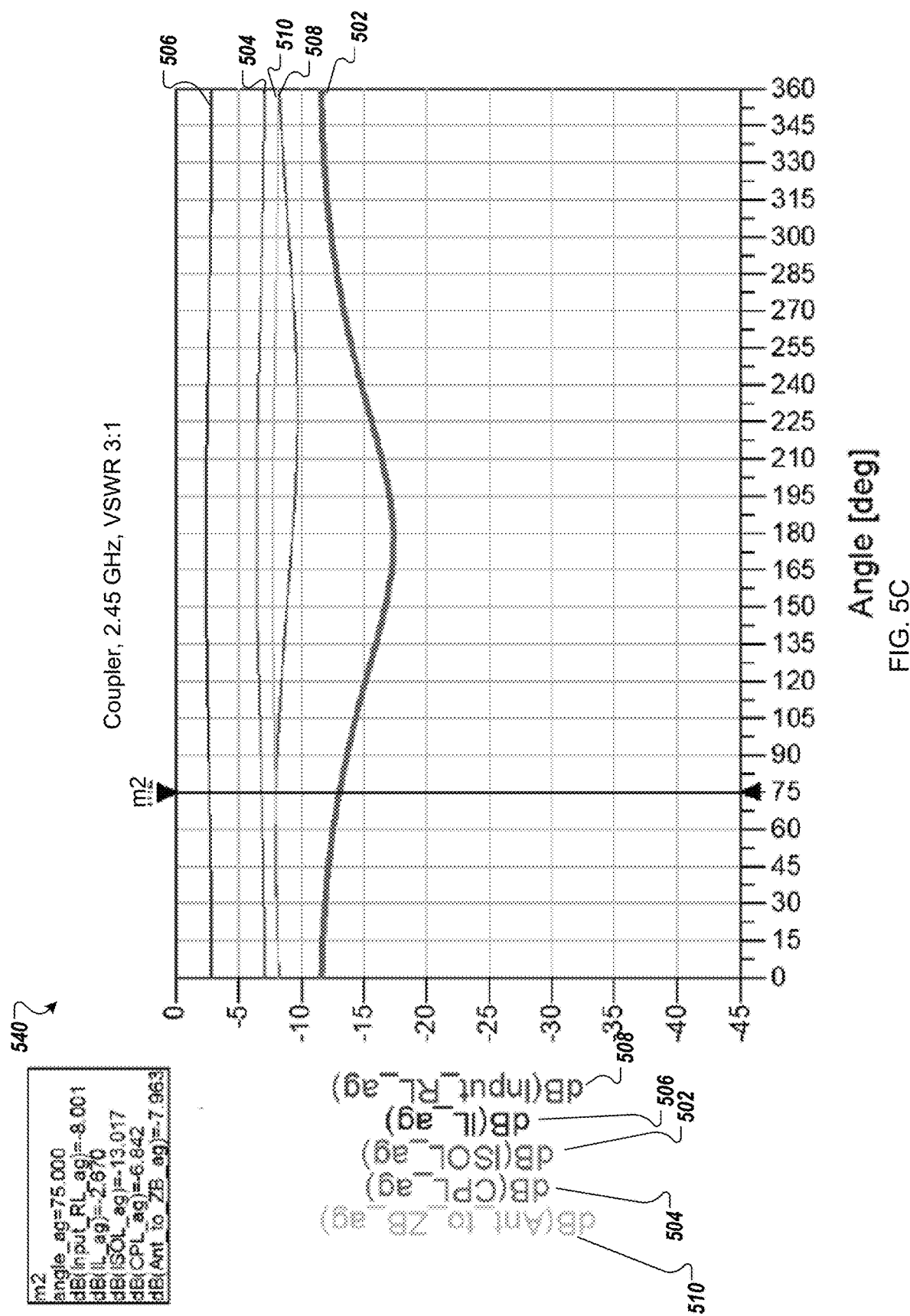
FIG. 5C is graph illustrating measured S-parameters of a directional coupler of the front-end circuitry of FIG. 4 with a VSWR of 3:1 and variable phase, at the antenna port according to one embodiment.

While simple, the use of the directional coupler 402 alone can have a degradation of the sought isolation, when the antenna port 422 is mismatched. For example, as shown in FIGS. 5A-5C, the nominal isolation of the directional coupler 402 degrades from −23 dB in VSWR 1:1, as illustrated in FIG. 5A, to −14 dB in VSWR 2:1, at 0 degree phase, as illustrated in FIG. 5B, and to −12 dB in VSWR 3:1, at 0 degree phase, as illustrated in FIG. 5C. In some cases, the directional coupler isolation can be as low as −10 dB (port mismatch), as compared to −30 dB minimum requirement.

FIG. 5A is graph 500 illustrating measured S-parameters of a coupler of the front-end circuitry 400 of FIG. 4 with a VSWR of 1:1 at the antenna port according to one embodiment. The measured S-parameters include ISOL 502, CPL 504, IL 506, and RL 508. S-parameter results of the front-end circuitry 400 of FIG. 4 have been obtained from the S-parameters for the directional coupler 402 (e.g., ACX CP1608-06A2450). As shown in graph 500, the ISOL 502 is approximately −23.262 dB, the CPL 304 is approximately −6.746 dB, the IL 306 is approximately −1.383 dB, the RL 308 is approximately −27.536 dB, and a CPL 510 between the antenna 106 and the second radio 103 is approximately −6.746 dB. It should be noted that the measured S-parameters are measured with VSWR being 1:1, which may not reflect actual conditions due to the mismatched antenna. The following graphs illustrate the same measured S-parameters at 3:1 and 4:1 VSWR.

FIG. 5B is graph 520 illustrating measured S-parameters of a coupler of the front-end circuitry 400 of FIG. 4 with a VSWR of 2:1 and variable phase at the antenna port according to one embodiment. As shown in graph 520, the ISOL 502, the CPL 504, the IL 506, the RL 508, and CPL 510 all vary as a function of the load phase angle. For example, at load phase angle of 75°, the ISOL 502 is approximately −15.832 dB, the CPL 504 is approximately −6.809 dB, the IL 506 is approximately −1.919 dB, the RL 508 is approximately −11.127 dB, and the CPL 510 is approximately −7.212 dB.

FIG. 5C is graph 540 illustrating measured S-parameters of a coupler of the front-end circuitry 400 of FIG. 4 with a VSWR of 3:1 and variable phase at the antenna port according to one embodiment. As shown in graph 540, the ISOL 502, the CPL 504, the IL 506, the RL 508, and the CPL 510 all vary as a function of the load phase angle. For example, at load phase angle of 75°, the ISOL 502 is approximately −13.017 dB, the CPL 504 is approximately −6.842 dB, the IL 506 is approximately −2.670 dB, the RL 508 is approximately −8.001 dB, and the CPL 510 is approximately −7.963 dB.

As compared to FIGS. 3A-3C, it should be noted that with the phase within the front-end circuitry 100 being programmable, the isolation can be maintained and increased to a substantial degree. The phase-shifter circuit can be used to adjust the phase using a simple calibration, resulting in the isolation being approximately −28.5 dB in VSWR 3:1 and −32.8 dB in VSWR 4:1. As such, the higher the antenna mismatch, the higher the isolation becomes when using the front-end circuitry 100.

Figure 6A:
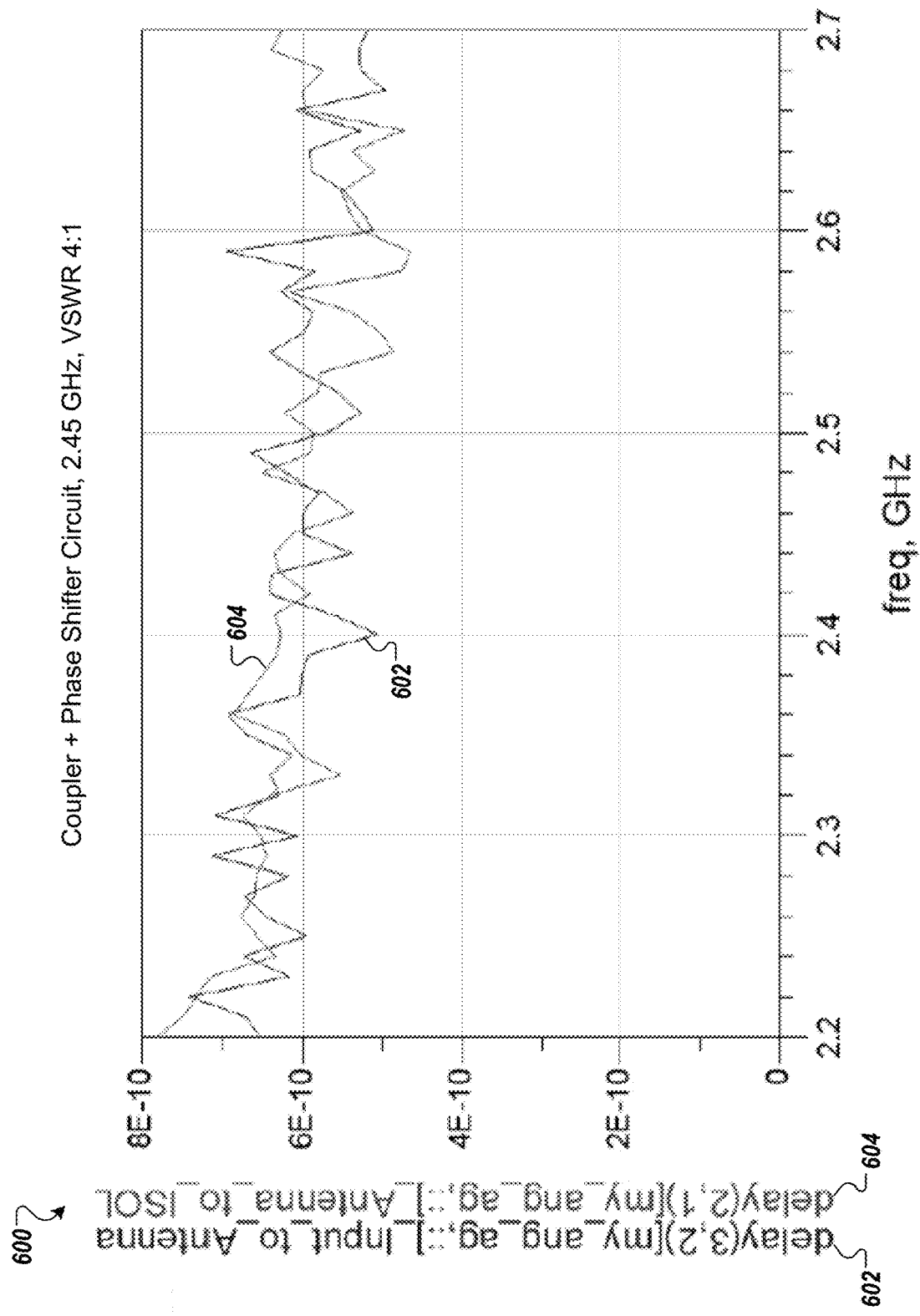
FIG. 6A is a graph illustrating a group delay at maximum isolation across a frequency band of the front-end circuitry of FIG. 1 according to one embodiment.

FIG. 6A is a graph 600 illustrating a group delay at maximum isolation across a frequency band of the front-end circuitry of FIG. 1 according to one embodiment. Graph 600 shows a first group delay 602 between the input port 120 and the antenna 106 (i.e. antenna port 132) and a second group delay 604 between the antenna 106 (i.e. antenna port 132) and the isolated port 124 with a VSWR of 4:1 at the antenna port 122 between 2.2 GHz and 2.7 GHz. The first group delay 602 takes into account the delay from the input port 120, through the directional coupler 102 and the phase-shifter circuit 108, to the antenna 106 in a first direction. The second group delay 604 takes into account the delay from the antenna 106, through the phase-shifter circuit 108 and the directional coupler 102, to the isolated port 124 in a second direction.

Figure 6B:
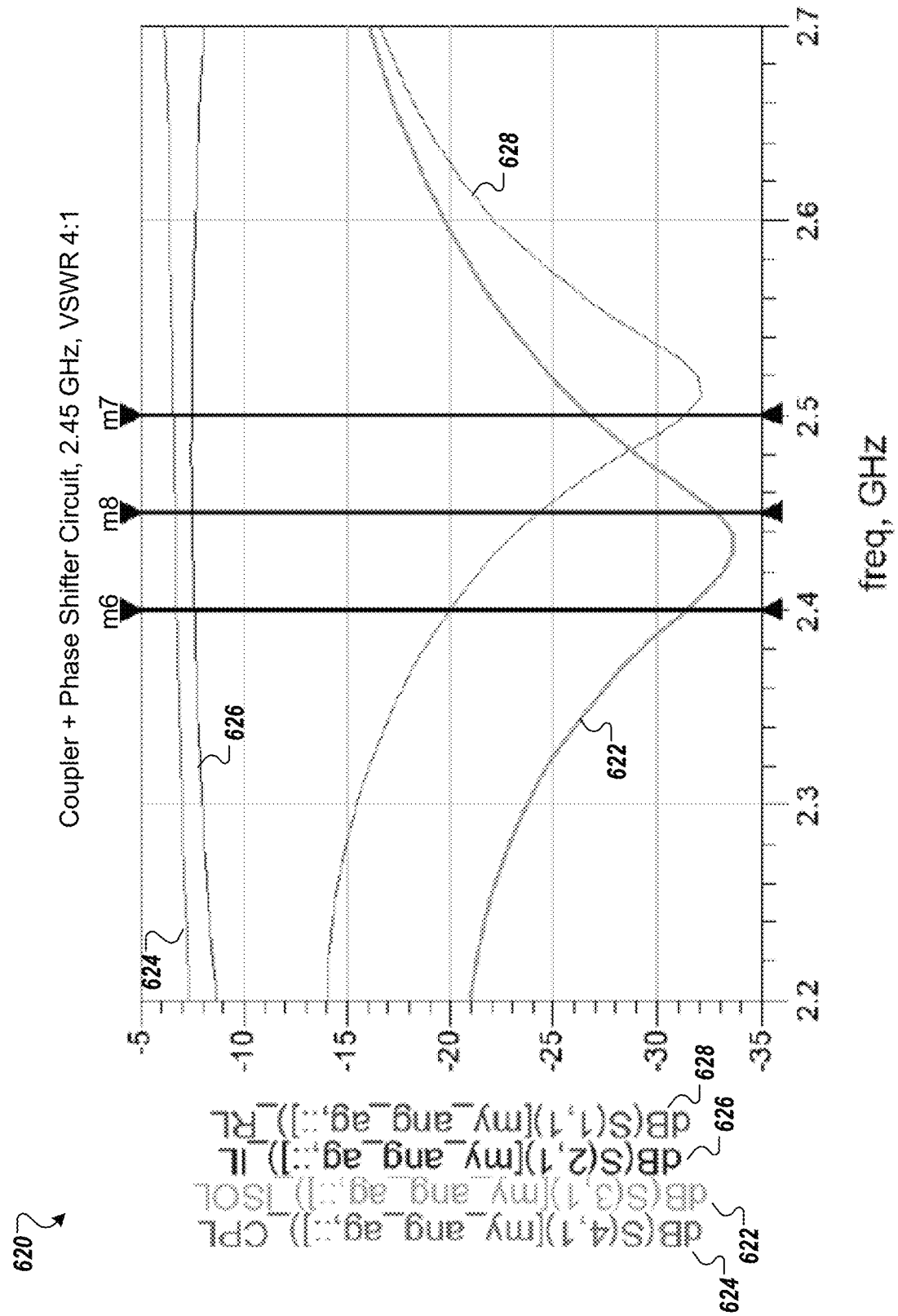
FIG. 6B is a graph illustrating how settings of the front-end circuitry of FIG. 1 hold across the frequency band once the phase is adjusted for maximum isolation at a middle band according to one embodiment.

FIG. 6B is a graph 620 illustrating how settings of the front-end circuitry of FIG. 1 hold across the frequency band once the phase is adjusted for maximum isolation at a middle band according to one embodiment. Once the phase is adjusted for maximum isolation at a middle band, graph 620 shows the S-parameters across the frequency band between 2.2 GHz and 2.7 GHz. In particular, the measured S-parameters in graph 620 include ISOL 622, CPL 624, IL 626, and RL 628. The S-parameter results of the front-end circuitry 100 of FIG. 1 have been obtained by combining the measured S-parameters for the directional coupler 102 (e.g., ACX CP1608-06A2450) and the measured S-parameters for the phase-shifter circuit 108. As shown in graph 620, the ISOL 622 and the RL 628 are less then −27 dB and −20 dB, respectively, between 2.4 GHz and 2.5 GHz.

As described herein, an isolation null can be formed at the isolated port 124. The magnitude and bandwidth of the isolation null can depend on a combination of the following four parameters: 1) Magnitude of the VSWR (i.e. reflected wave) at the antenna port 132; 2) Phase of the reflected wave, at the antenna port 132; 3) Coupling factor of the directional coupler 102; and 4) Directivity of the directional coupler 102. FIGS. 7A-7D illustrate a case study on producing a deep isolation null at the isolated port 124, for a lossless, ideal 3 dB coupler, with 10 dB of directivity.

Figure 7A:
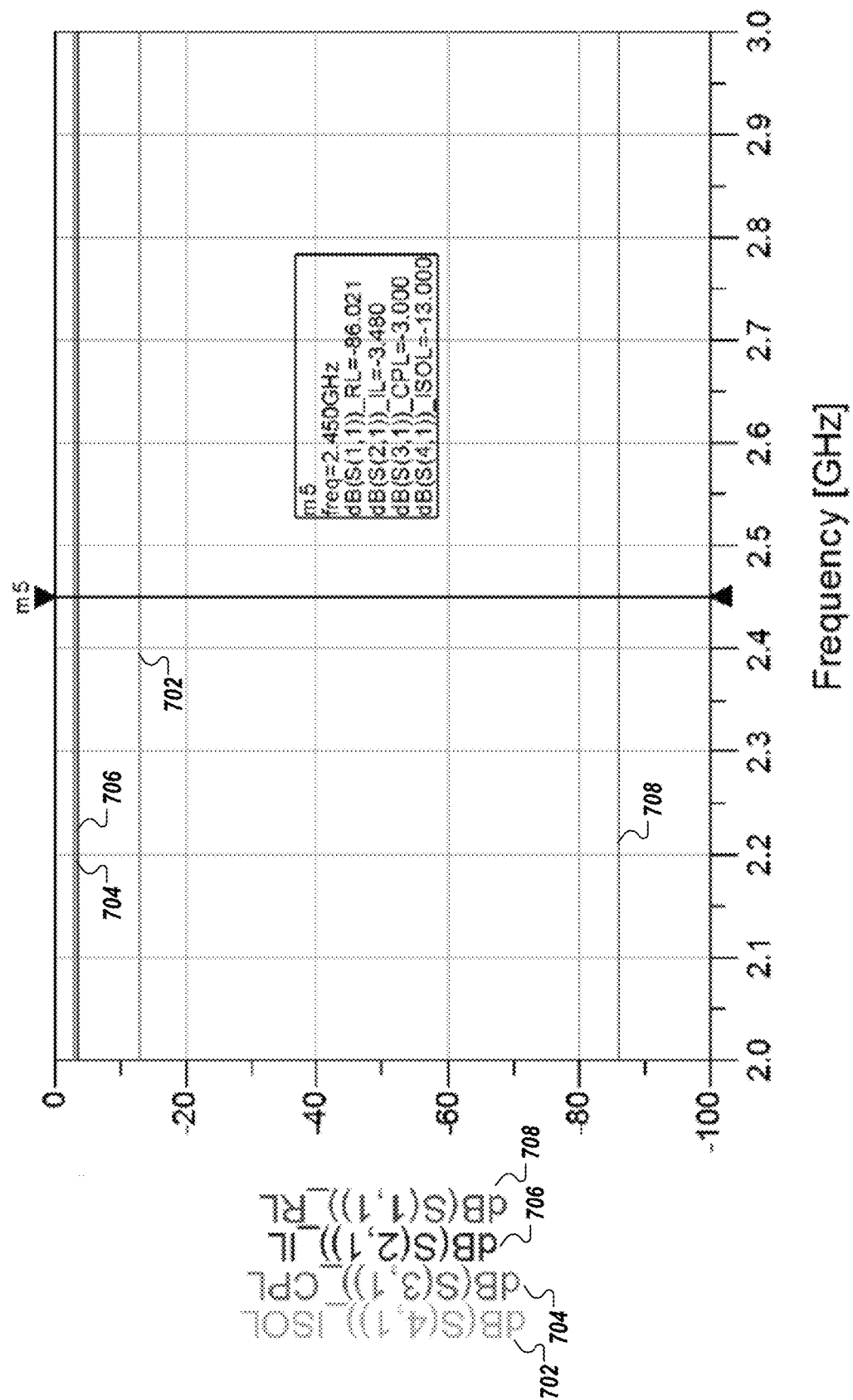
FIG. 7A-7D illustrates a case study on producing a deep null at the isolated port for a lossless, ideal 3 dB directional coupler with 10 dB of directivity according to one embodiment.

FIG. 7A-7D illustrates a case study on producing a deep null at the isolated port for a lossless, ideal 3 dB coupler with 10 dB of directivity according to one embodiment. In particular, FIG. 7A illustrates a graph 700 of the S-parameters for an ideal 3 dB coupler of directivity 10 dB in a 50-Ohm reference impedance, at all ports. The S-parameters of graph 700 include ISOL 702, CPL 704, IL 706, and RL 708. As shown in graph 700, the ISOL 702 is approximately −13 dB, the CPL 704 is approximately −3 dB, the IL 706 is approximately −3.48 dB, and the RL 708 is approximately −86.021 dB. It should be noted that the S-parameters are with VSWR being 1:1, which may not reflect actual conditions due to the mismatched antenna and phase-shifter circuit.

Figure 7B:
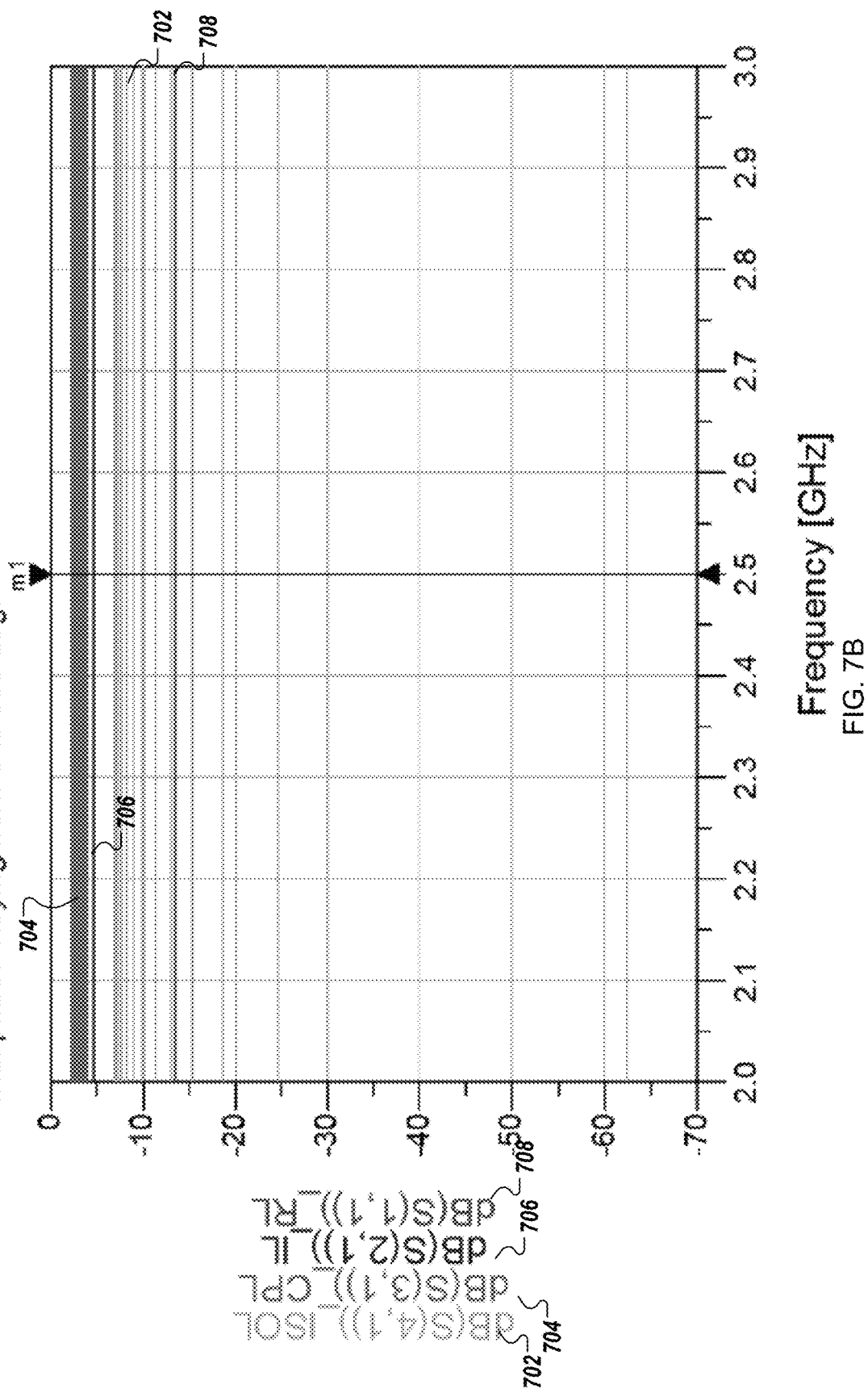

FIG. 7B illustrates a graph 720 of the S-parameters for the ideal 3 dB coupler of directivity of 10 dB with the magnitude of the load at the input port is VSWR 2.8:1 with phase varying from 0 to 360° across a frequency band between 2.0 GHz and 3.0 GHz.

Figure 7C:
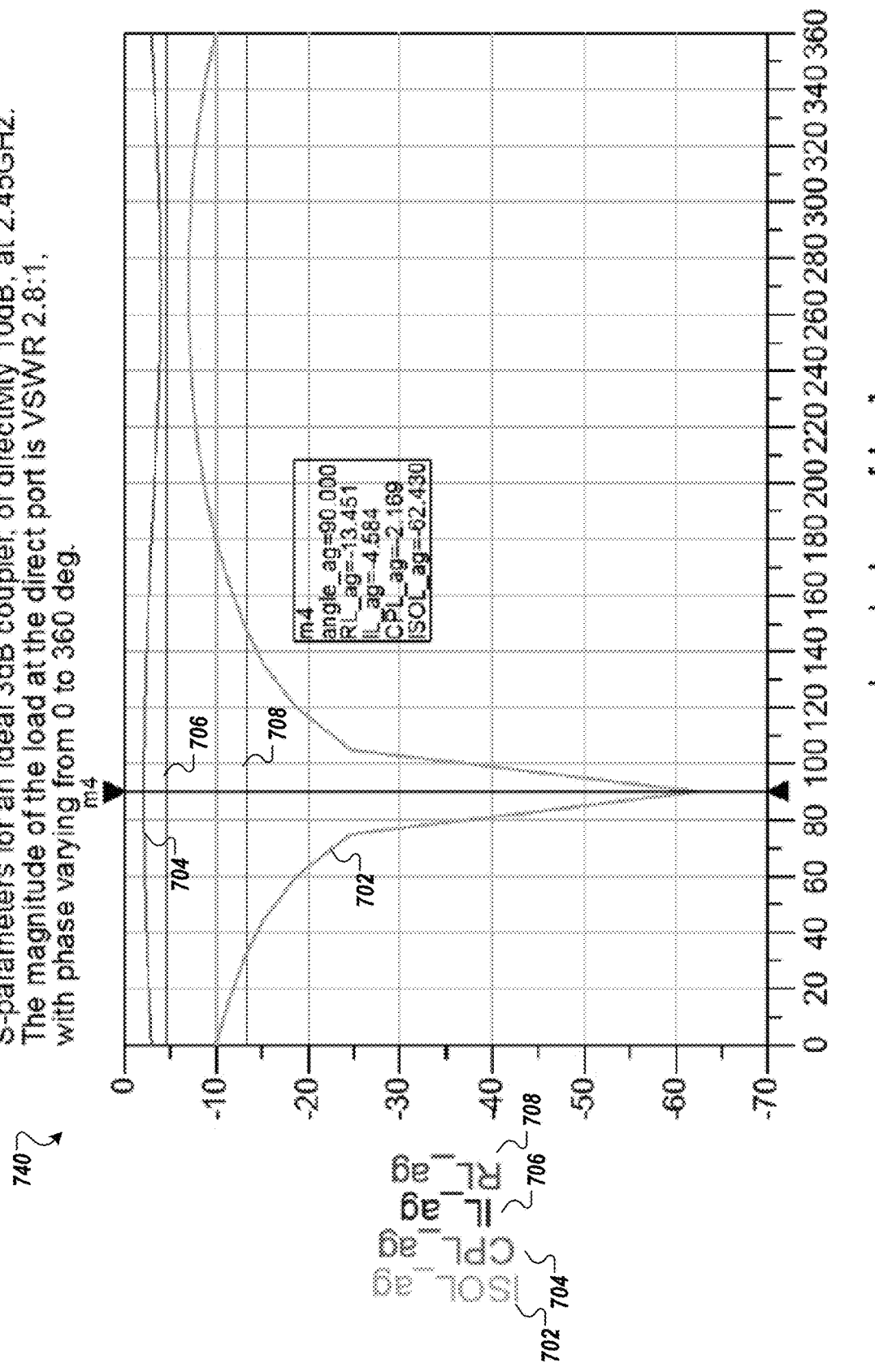

FIG. 7C illustrates a graph 740 of the S-parameters for the ideal 3 dB coupler of directivity of 10 dB when the magnitude of the mismatch at the direct (transmitted) port is VSWR 2.8:1 with phase varying from 0 to 360° at 2.45 GHz. As shown in graph 740, ISOL 702, the CPL 704, the IL 706, and the RL 708 all vary as a function of the load phase angle. An isolation null is created in the ISOL 702 at 90°. For example, at load phase angle of 90°, the ISOL 702 is approximately −62.430 dB, the CPL 704 is approximately −2.169 dB, the IL 706 is approximately −4.584 dB, and the RL 708 is approximately −13.451 dB.

Figure 7D:
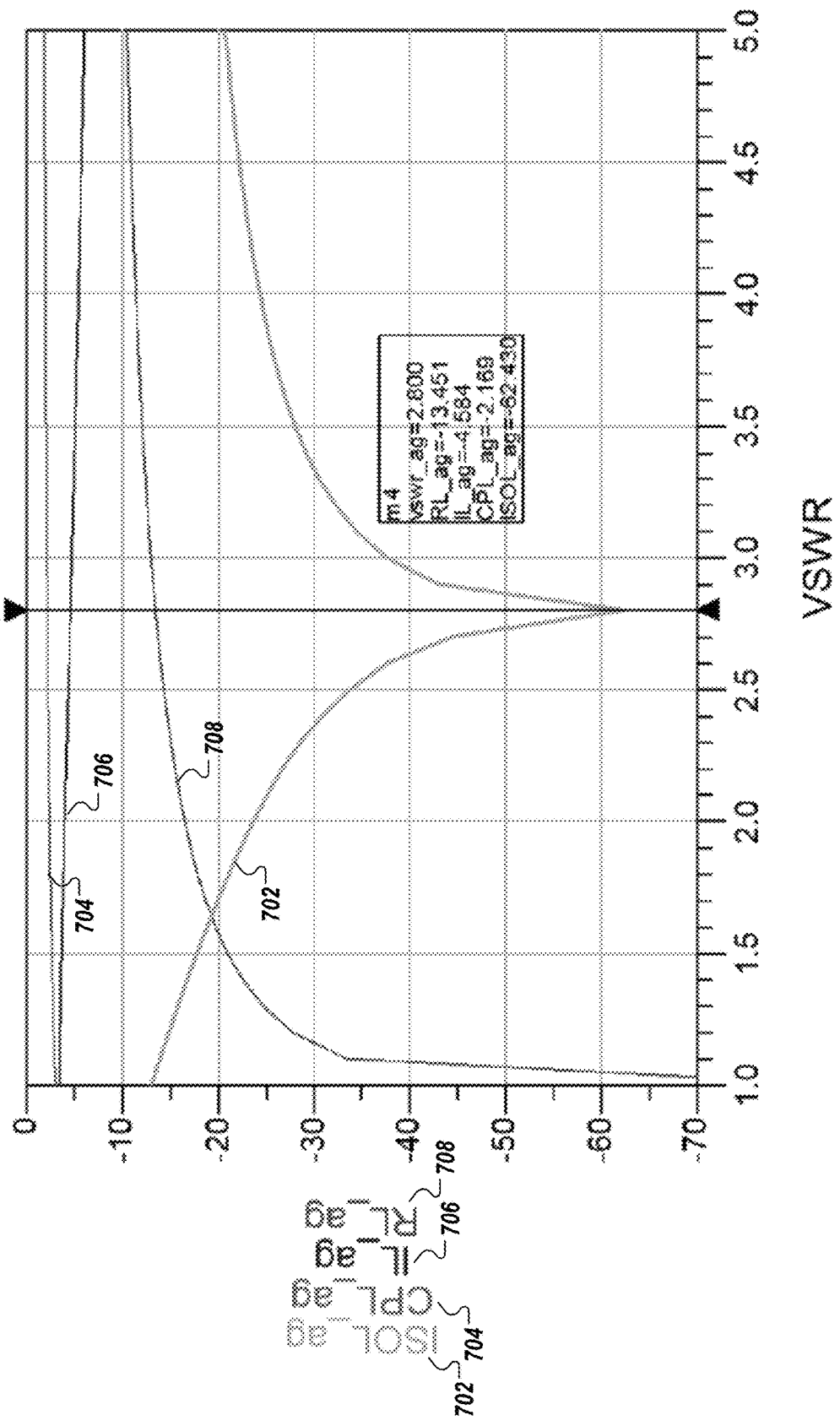

FIG. 7D illustrates a graph 760 of the S-parameters for the ideal 3 dB coupler of directivity of 10 dB with a phase of the load at the direct (transmitted) port being at 90° at 2.45 GHz and the a magnitude of mismatch at the direct port varies from VSWR 1:1 to 5:1. At VSWR 2.8:1, the ISOL 702 is approximately −62.430 dB, the CPL 704 is approximately −2.169 dB, the IL 706 is approximately −4.584 dB, and the RL 708 is approximately −13.451 dB.

Figure 8:
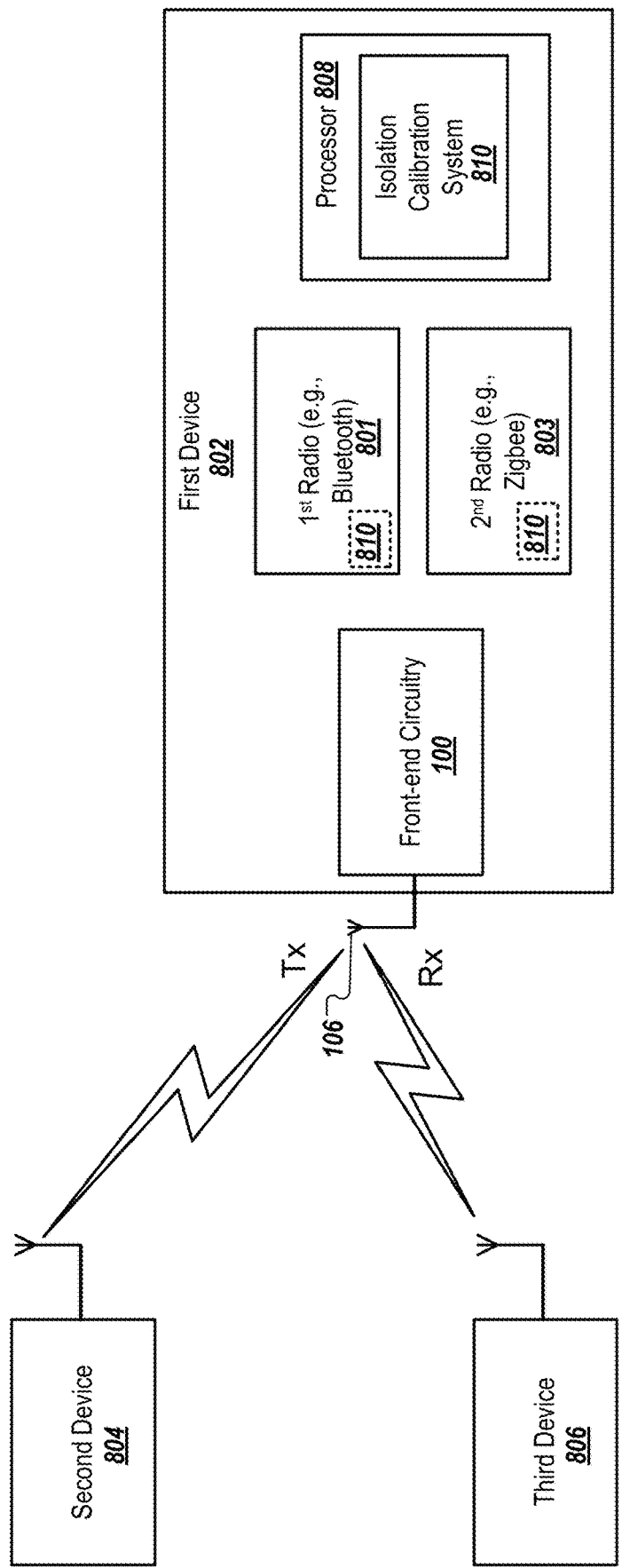
FIG. 8 is a network diagram illustrating a device that communicates with two other devices while sharing a single antenna and a same frequency band according to one embodiment.

FIG. 8 is a network diagram illustrating a device that communicates with two other devices while sharing a single antenna and a same frequency band according to one embodiment. In FIG. 8, a first device 802 includes the front-end circuitry 100, a first radio 801, a second radio 803, and a processor 808. The processor 808 can include an isolation calibration system 810 to calibrate the phase-shifter circuit of the front-end circuitry 100. For example, the isolation calibration system 810 can listen for packets transmitted by the first radio 801 and the isolation calibration system 810 can adjust the phase-shifter circuit via the control signal 130, such as by adjusting phase bits in the control signal 130 over the I2C interface, until a signal strength indicator (e.g., RSSI) is at a minimum value at second radio 803. Alternatively, the isolation calibration system 810 can be implemented in the first radio 801, the second radio 803, or any combination thereof. For example, the first radio 801 can measure the signal strength indicators of data being transmitted by the second radio 803 and adjust the phase of the front-end circuitry 100 until the signal strength indicator is at a minimum value or at a value corresponding to an acceptable level of isolation between the two radios. The processor 808 can communicate with a second device 804 by transmitting first data using the first radio 801 via the front-end circuitry 100 coupled to the antenna 106. For example, the first radio 801 can implement the Bluetooth® technology and can communicate the first data using the Bluetooth® protocol. The processor 808 can communicate with a third device 806 by receiving second data using the second radio 803 via the front-end circuitry 100 coupled to the antenna 106. For example, the second radio 803 can implement the ZigBee® technology and can communicate the second data using the ZigBee® protocol. The ZigBee® and Bluetooth® technology share the same frequency range and the first radio 801 and the second radio 803 share the same antenna 106 to communicate with the second device 804 and third device 806, respectively. Similarly, the first radio 801 can receive data from the second device 804 via the front-end circuitry 100 and the second radio 803 can transmit data to the third device 806 via the front-end circuitry 100.

In other embodiments, the first radio 801 and the second radio 803 can implement different wireless technologies in the 2.4 GHz ISM band. The first radio 801 and the second radio 803 can implement the Bluetooth® classic technology, Bluetooth® Low Energy (BLE) technology, ZigBee® technology, ZWave® technology, Wi-Fi® technology, or the like. The radios can be Wireless Local Area Network (WLAN) radios, Wireless Personal Area Network (WPAN) radios, cellular radios, Long Range (LoRa) radios, Body Area Network (BAN) radios, Near-Me (NAN) radios, or the like.

The processor 808 can be various type of processing devices, such as one or more Central Processing Units (CPUs), microcontrollers, field programmable gate arrays, or other types of processors or processing devices. The processor 808 can implement the isolation calibration system 810 using processing logic that comprises hardware (e.g., circuitry, dedicated logic, programmable logic, microcode, etc.), software, firmware, or a combination thereof, for calibrating a phase of the phase-shifter circuit of the front-end circuitry 100. The isolation calibration system 810 can measure signals strengths and adjust the phase to create the isolation null at the isolated port as described herein, allowing the first device 802 to communicate with both the second device 804 and the third device 806 using the same antenna 106 and within the same frequency band.

Figure 9:
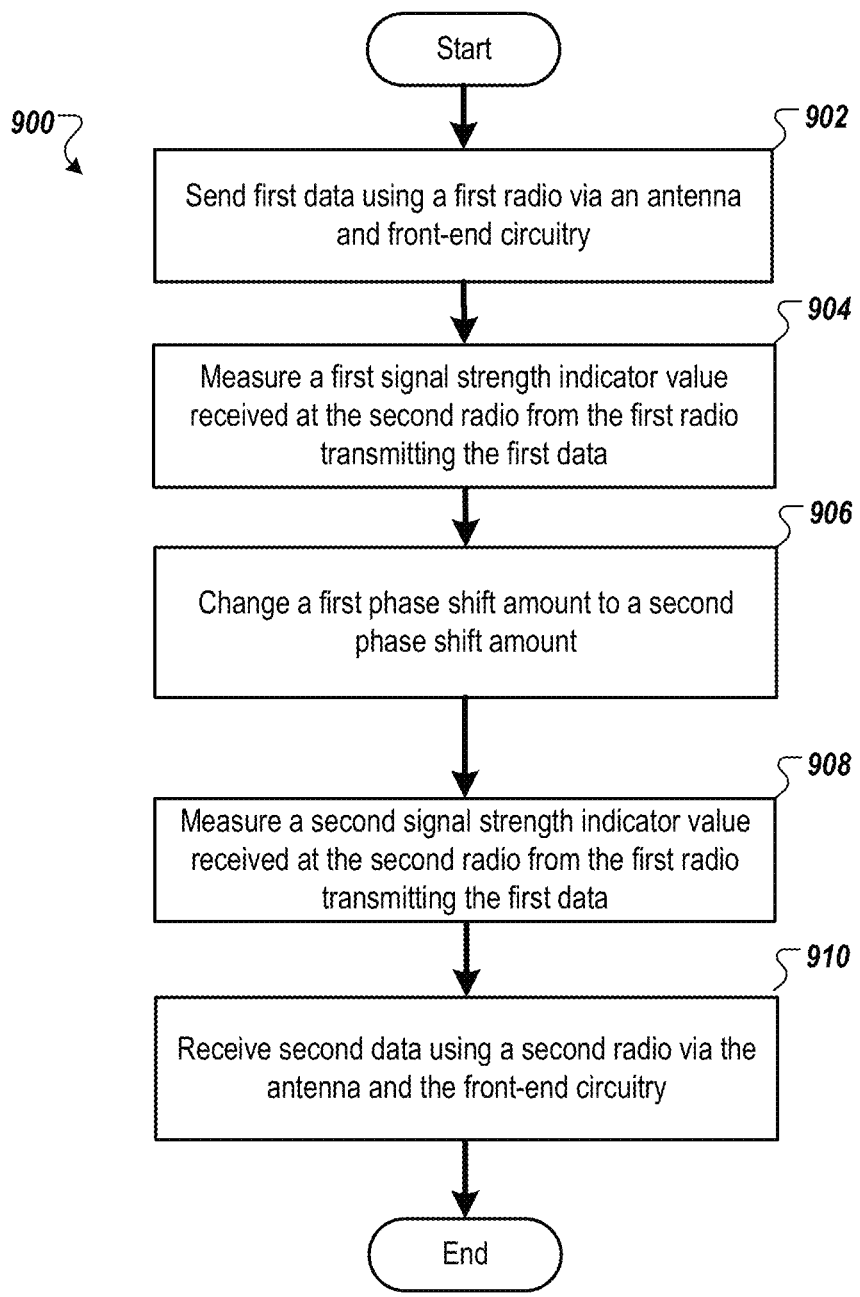
FIG. 9 is a flow diagram of a method for operating a device with two radios that share an antenna and a frequency band according to one embodiment.

FIG. 9 is a flow diagram of a method 900 for operating a device with two radios that share an antenna and a frequency band according to one embodiment. The method 900 may be performed by processing logic that comprises hardware (e.g., circuitry, dedicated logic, programmable logic, microcode, etc.), software, firmware, or a combination thereof. In one embodiment, the method 900 may be performed by any of the devices described herein and illustrated with respect to FIGS. 1-8.

Referring back to FIG. 9, the method 900 begins by the processing logic sending first data by a first radio of a first device to a second device via front-end circuitry comprising a coupler and a phase-shifter circuit (block 902). The first radio operates in a frequency band. The processing logic measures a first signal strength indicator value of a first signal received by a second radio while the phase-shifter circuit is set to apply a first phase shift amount to a reflected wave at the antenna (block 904). The first signal strength indicator value corresponds to the first data being transmitted by the first radio. The processing logic changes the first phase shift amount of the phase-shifter circuit to a second phase shift amount such that the reflected wave has a 90-degrees phase shift from a phase of an incident wave (block 906). The processing logic measures a second signal strength indicator value of a second signal received by the second radio while the phase-shifter circuit is set to apply the second phase shift amount (block 908). The second signal strength indicator value is less than the first signal strength indicator value. The process continues until the second signal strength indicator value reaches a minimum value. The processing logic sets the phase-shifter circuit to the second phase shift amount as the calibrated phase shift amount that result in the first 90-degrees phase shift, the second 90-degrees phase shifting being caused by the directional coupler. The second phase shift amount corresponds to the minimum value. The processing logic receives second data by a second radio of the first device from a third device via the antenna (block 910), and the method 900 ends. The second radio operates in the same frequency band.

In one embodiment, at block 902, the first radio applies an incident wave to a first port of the directional coupler. The incident wave corresponds to the first data. The incident wave propagates through the directional coupler to a second port of the directional coupler that is coupled to the phase-shifter circuit. A reflected wave, caused by a combination of the phase-shifter circuit and an impedance mismatch of the antenna, is reflected at a port of the phase-shifter circuit coupled to the antenna. The reflected wave undergoes a "X" degree phase shift and propagates back through the directional coupler to a third port of the directional coupler that is coupled to the second radio. The reflected wave undergoes another 90-degrees phase shift propagating through the directional coupler to the third port. An isolation null that cancels a copy of the incident wave that is present at the third port as a result of the incident wave being applied to the first port is achieved when the "X" degree is brought to be 90 degrees through phase adjustment (calibration) in the phase shifter. That is, when calibrated, the X degree phase shift should be 90 degrees or approximately 90 degrees. The 90 degrees can be achieved by adjust the phase shift amount being applied by the phase-shifter circuit as described herein. In one embodiment, at block 904, the processing logic receives the second data by receiving, at the second port, a second incident wave at the second port of the directional coupler. The second incident wave corresponds to the second data. The second incident wave propagates through the directional coupler from the second port to the third port of the directional coupler.

In another embodiment, the processing logic changes the first phase shift amount to the second phase shift amount by sending, by the second radio, a control signal to the phase-shifter circuit. The control signal changes the first phase shift amount to the second phase shift amount. In another embodiment, the processing logic changes the first phase shift amount to the second phase shift amount by sending, by a processor, a control signal to the phase-shifter circuit. The control signal changes the first phase shift amount to the second phase shift amount. In another embodiment, the processing logic changes the first phase shift amount to the second phase shift amount by adjusting phase bits of a digital control signal and sending the digital control signal to the phase-shifter circuit. The control signal can adjust the first phase shift amount to the second phase shift amount such that the reflected wave at the third port has the third phase that is 180-degrees from the first phase of the incident wave, canceling a copy of the incident wave at the second port that is present on the third port.

In another embodiment, the processing logic listens for packets transmitted by the first radio while the phase-shifter circuit is set to the first phase shift amount and the second phase shift amount and determines that a signal strength indicator of the packets is a minimum value or below a specified value when the phase-shifter circuit is set to the second phase shift amount.

In another embodiment, the method includes sending, by a first radio of a first device, first data to a second device via an antenna coupled to front-end circuitry comprising a coupler and a phase-shifter circuit, the first radio operating in a frequency band. The method further includes measuring a first signal strength indicator value of a first signal received by a second radio while the phase-shifter circuit is set to apply a first phase shift amount to a reflected wave, wherein the first signal strength indicator value corresponds to the first data being transmitted by the first radio. The method further includes changing the first phase shift amount to a second phase shift amount such that the reflected wave, at a second port of the directional coupler that is coupled to the at the second radio, has a second phase that is that is 180-degrees from a first phase of an incident wave received at a first port of the directional coupler that is coupled to the first radio. The method further includes measuring a second signal strength indicator value of a second signal received by the second radio while the phase-shifter circuit is set to apply the second phase shift amount, wherein the second signal strength indicator value is less than the first signal strength indicator value. The method further includes receiving, by the second radio of the first device, second data from a third device via the antenna, the second radio operating in the frequency band.

In a further embodiment, the sending the first data comprises applying, by the first radio, the incident wave to the first port of the directional coupler, the incident wave corresponding to the first data. The receiving the second data comprises: receiving, by the directional coupler, the incident wave at the first port having the first phase; causing, by the phase-shifter circuit, a first reflected wave, at a third port of the directional coupler that is coupled to the phase-shifter circuit, to have a third phase that is 90-degrees from the first phase; outputting, by the directional coupler, a second reflected wave, at the second port, that has the second phase that is 180-degrees from the first phase of the incident wave, wherein the second reflected wave cancels a copy of the incident wave at the second port caused by the incident wave being received at the first port; and receiving, at the second port, a second incident wave at the second port of the directional coupler, wherein the second incident wave corresponds to the second data, wherein the second incident wave propagates through the directional coupler from the third port to the second port of the directional coupler.

Figure 10:
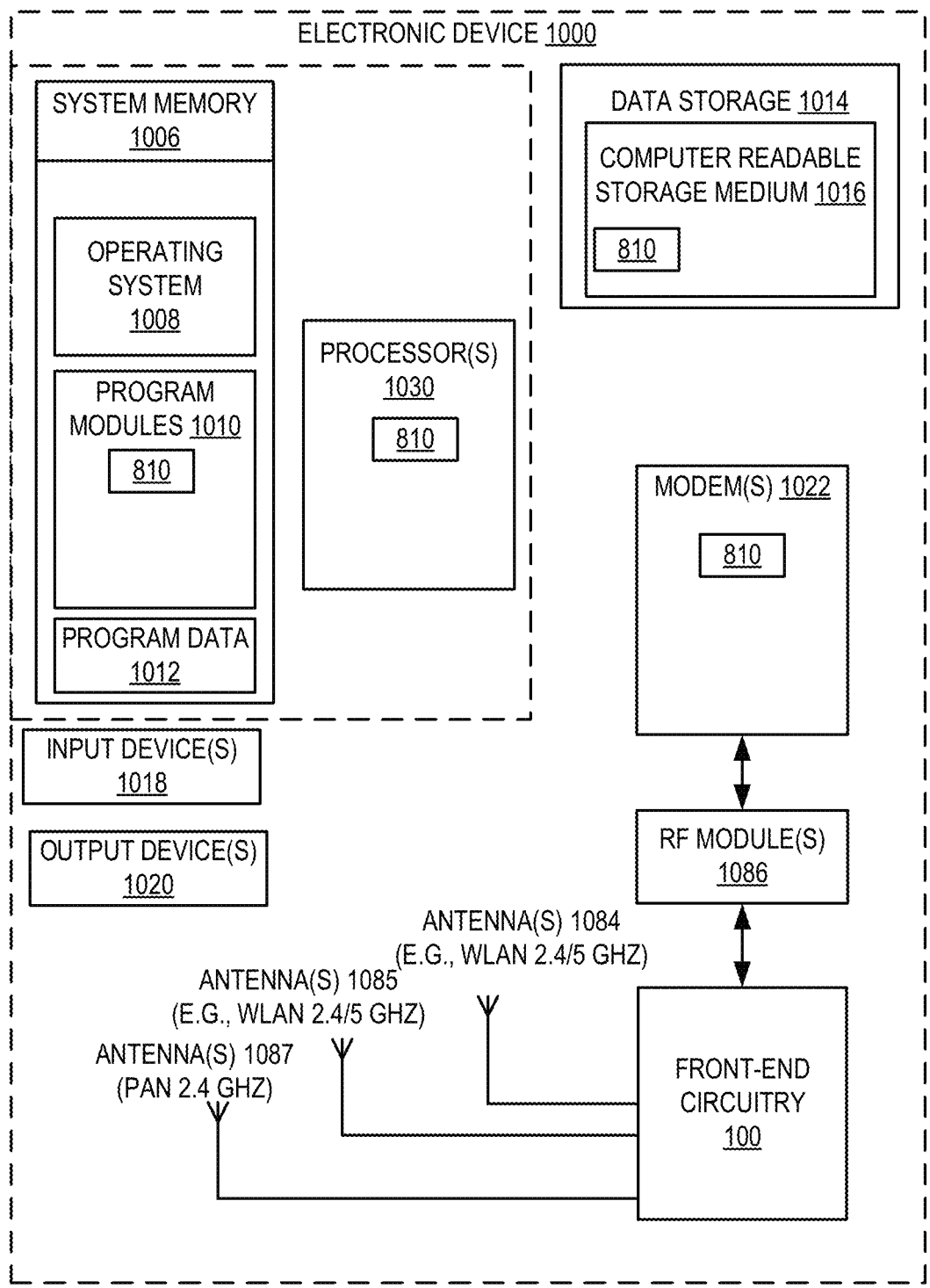
FIG. 10 is a block diagram of an electronic device with front-end circuitry for sharing an antenna and a frequency band according to one embodiment.

FIG. 10 is a block diagram of an electronic device 1000 with front-end circuitry for sharing an antenna and a frequency band according to one embodiment. The electronic device 1000 may correspond to the electronic devices described above with respect to FIGS. 1-9. Alternatively, the electronic device 1000 may be other electronic devices, as described herein.

The electronic device 1000 includes one or more processor(s) 1030, such as one or more CPUs, microcontrollers, field programmable gate arrays, or other types of processors. The electronic device 1000 also includes system memory 1006, which may correspond to any combination of volatile and/or non-volatile storage mechanisms. The system memory 1006 stores information that provides operating system component 1008, various program modules 1010, program data 1012, and/or other components. In one embodiment, the system memory 1006 stores instructions of methods to control operation of the electronic device 1000. The electronic device 1000 performs functions by using the processor(s) 1030 to execute instructions provided by the system memory 1006. In one embodiment, the program modules 1010 may include an isolation calibration system 810. The isolation calibration system 810 may perform some or all of the operations of the isolation calibration processes descried herein, such as method 900.

The electronic device 1000 also includes a data storage device 1014 that may be composed of one or more types of removable storage and/or one or more types of non-removable storage. The data storage device 1014 includes a computer-readable storage medium 1016 on which is stored one or more sets of instructions embodying any of the methodologies or functions described herein. Instructions for the program modules 1010 (e.g., isolation calibration system 810) may reside, completely or at least partially, within the computer-readable storage medium 1016, system memory 1006 and/or within the processor(s) 1030 during execution thereof by the electronic device 1000, the system memory 1006 and the processor(s) 1030 also constituting computer-readable media. The electronic device 1000 may also include one or more input devices 1018 (keyboard, mouse device, specialized selection keys, etc.) and one or more output devices 1020 (displays, printers, audio output mechanisms, etc.).

The electronic device 1000 further includes a modem 1022 to allow the electronic device 1000 to communicate via a wireless connections (e.g., such as provided by the wireless communication system) with other computing devices, such as remote computers, an item providing system, and so forth. The modem 1022 can be connected to one or more radio frequency (RF) modules 1086. The RF modules 1086 may be a WLAN module, a WAN module, WPAN module, Global Positioning System (GPS) module, or the like. The antenna structures (antenna(s) 1084, 1085, 1087) are coupled to the front-end circuitry 100, which is coupled to the modem 1022. The front-end circuitry 100 may include radio front-end circuitry, antenna switching circuitry, impedance matching circuitry, or the like. The antennas 1084 may be GPS antennas, Near-Field Communication (NFC) antennas, other WAN antennas, WLAN or PAN antennas, or the like. The modem 1022 allows the electronic device 1000 to handle both voice and non-voice communications (such as communications for text messages, multimedia messages, media downloads, web browsing, etc.) with a wireless communication system. The modem 1022 may provide network connectivity using any type of mobile network technology including, for example, Cellular Digital Packet Data (CDPD), General Packet Radio Service (GPRS), EDGE, Universal Mobile Telecommunications System (UMTS), Single-Carrier Radio Transmission Technology (1xRTT), Evaluation Data Optimized (EVDO), Hhigh-Speed Down-Link Packet Access (HSDPA), Wi-Fi®, Long Term Evolution (LTE) and LTE Advanced (sometimes generally referred to as 4G), etc.

The modem 1022 may generate signals and send these signals to antenna(s) 1084 of a first type (e.g., WLAN 5 GHz), antenna(s) 1085 of a second type (e.g., WLAN 2.4 GHz), and/or antenna(s) 1087 of a third type (e.g., WAN), via front-end circuitry 100, and RF module(s) 1086 as descried herein. Antennas 1084, 1085, 1087 may be configured to transmit in different frequency bands and/or using different wireless communication protocols. The antennas 1084, 1085, 1087 may be directional, omnidirectional, or non-directional antennas. In addition to sending data, antennas 1084, 1085, 1087 may also receive data, which is sent to appropriate RF modules connected to the antennas. One of the antennas 1084, 1085, 1087 may be any combination of the antenna structures described herein.

In one embodiment, the electronic device 1000 establishes a first connection using a first wireless communication protocol, and a second connection using a different wireless communication protocol. The first wireless connection and second wireless connection may be active concurrently, for example, if an electronic device is receiving a media item from another electronic device via the first connection) and transferring a file to another electronic device (e.g., via the second connection) at the same time. Alternatively, the two connections may be active concurrently during wireless communications with multiple devices. In one embodiment, the first wireless connection is associated with a first resonant mode of an antenna structure that operates at a first frequency band and the second wireless connection is associated with a second resonant mode of the antenna structure that operates at a second frequency band. In another embodiment, the first wireless connection is associated with a first antenna structure and the second wireless connection is associated with a second antenna.

Though a modem 1022 is shown to control transmission and reception via antenna (1084, 1085, 1087), the electronic device 1000 may alternatively include multiple modems, each of which is configured to transmit/receive data via a different antenna and/or wireless transmission protocol.

In the above description, numerous details are set forth. It will be apparent, however, to one of ordinary skill in the art having the benefit of this disclosure, that embodiments may be practiced without these specific details. In some instances, well-known structures and devices are shown in block diagram form, rather than in detail, in order to avoid obscuring the description.

Some portions of the detailed description are presented in terms of algorithms and symbolic representations of operations on data bits within a computer memory. These algorithmic descriptions and representations are the means used by those skilled in the data processing arts to convey the substance of their work most effectively to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "inducing," "parasitically inducing," "radiating," "detecting," etermining," "generating," "communicating," "receiving," "disabling," or the like, refer to the actions and processes of a computer system, or similar electronic computing device, that manipulates and transforms data represented as physical (e.g., electronic) quantities within the computer system's registers and memories into other data similarly represented as physical quantities within the computer system memories or registers or other such information storage, transmission or display devices.

Embodiments also relate to an apparatus for performing the operations herein. This apparatus may be specially constructed for the required purposes, or it may comprise a general-purpose computer selectively activated or reconfigured by a computer program stored in the computer. Such a computer program may be stored in a computer readable storage medium, such as, but not limited to, any type of disk including floppy disks, optical disks, Read-Only Memories (ROMs), compact disc ROMs (CD-ROMs) and magnetic-optical disks, Random Access Memories (RAMs), EPROMs, EEPROMs, magnetic or optical cards, or any type of media suitable for storing electronic instructions.

The algorithms and displays presented herein are not inherently related to any particular computer or other apparatus. Various general-purpose systems may be used with programs in accordance with the teachings herein, or it may prove convenient to construct a more specialized apparatus to perform the required method steps. The required structure for a variety of these systems will appear from the description below. In addition, the present embodiments are not described with reference to any particular programming language. It will be appreciated that a variety of programming languages may be used to implement the teachings of the present embodiments as described herein. It should also be noted that the terms "when" or the phrase "in response to," as used herein, should be understood to indicate that there may be intervening time, intervening events, or both before the identified operation is performed.

It is to be understood that the above description is intended to be illustrative, and not restrictive. Many other embodiments will be apparent to those of skill in the art upon reading and understanding the above description. The scope of the present embodiments should, therefore, be determined with reference to the appended claims, along with the full scope of equivalents to which such claims are entitled.

What is claimed is:

1. A device comprising:
   an antenna;
   a first radio;
   a second radio;
   a directional coupler comprising a first port coupled to the first radio, a second port coupled to the second radio, a third port, and a fourth port coupled to an impedance matched load; and
   a phase-shifter circuit coupled to the third port and the antenna,
   wherein:
      the directional coupler receives an incident wave at the first port having a first phase;
      the phase-shifter circuit causes a first reflected wave at the third port to have a second phase that is 90-degrees from the first phase; and
      the directional coupler outputs a second reflected wave, at the second port, that has a third phase that is 180-degrees from the first phase of the incident wave; and
      the second reflected wave cancels a copy of the incident wave at the second port caused by the incident wave received at the first port.

2. The device of claim 1, wherein the phase-shifter circuit comprises a digital phase shifter.

3. The device of claim 1, wherein the phase-shifter circuit comprises an analog phase shifter.

4. The device of claim 1, wherein the directional coupler and the phase-shifter circuit are integrated in a single integrated circuit.

5. The device of claim 1, wherein the directional coupler and the phase-shifter circuit are integrated in a Silicon-on-Insulator (SOI) integrated circuit.

6. The device of claim 1, further comprising a processor coupled to the first radio and the second radio, wherein the processor is to send a control signal to the phase-shifter circuit, wherein the control signal adjusts a first phase shift amount applied to the first reflected wave to a second phase shift amount such that the second reflected wave at the second port has the third phase that is 180-degrees from the first phase of the incident wave.

7. The device of claim 1, wherein the second radio is to:
   measure a first signal strength indicator value of a first signal transmitted by the first radio while the phase-shifter circuit is set to apply a first phase shift amount to the first reflected wave;
   send a control signal to the phase-shifter circuit to change the first phase shift amount to a second phase shift amount; and
   measure a second signal strength indicator value of a second signal transmitted by the first radio while the phase-shifter circuit is set to apply the second phase shift amount to the first reflected wave, wherein the second signal strength indicator value is less than the first signal strength indicator value, wherein application of the second phase shift amount to the first reflected wave results in the second reflected wave at the second port having the third phase that is 180-degrees from the first phase of the incident wave.

8. The device of claim 1, wherein the phase-shifter circuit comprises a digital phase shifter, wherein the second radio is to perform an isolation calibration process in which the second radio:
   listens for packets transmitted by the first radio; and
   adjusts, via a control signal sent from the second radio to the phase-shifter circuit, a phase shift amount until a signal strength indicator value of the packets is a lowest signal strength indicator value that results from adjusting the phase shift amount or until the signal strength indicator value is below a threshold value.

9. A Radio Frequency (RF) front-end circuit comprising:
   a directional coupler comprising a first port coupled to a first radio, a second port coupled to a second radio, a third port, and a fourth port coupled to an impedance matched load; and
   a phase-shifter circuit comprising a fifth port coupled to the third port and a sixth port coupled to an antenna, wherein the directional coupler receives an incident wave at the first port having a first phase, wherein the phase-shifter circuit is calibrated to cause a first reflected wave at the third port to have a second phase that is 90-degrees from the first phase, and wherein the directional coupler outputs a second reflected wave, at the second port, that has a third phase that is 180-degrees from the first phase of the incident wave, canceling a copy of the incident wave that is present at the second port caused by the incident wave received at the first port.

10. The RF front-end circuit of claim 9, wherein the phase-shifter circuit comprises a digital phase shifter.

11. The RF front-end circuit of claim 9, wherein the phase-shifter circuit comprises an analog phase shifter.

12. The RF front-end circuit of claim 9, wherein the directional coupler and the phase-shifter circuit are integrated in a single integrated circuit.

13. The RF front-end circuit of claim 9, wherein the directional coupler and the phase-shifter circuit are integrated in a Silicon-on-Insulator (SOI) integrated circuit.

14. The RF front-end circuit of claim 9, wherein the phase-shifter circuit comprises a control input that receives a control signal, wherein the control signal adjusts a first phase shift amount applied to the first reflected wave to a second phase shift amount applied to the first reflected wave such that the second reflected wave at the second port has the third phase that is 180-degrees from the first phase of the incident wave.

15. A device comprising:
   a first radio;
   a second radio; and
   a radio frequency (RF) front-end circuit comprising a first port coupled to the first radio, a second port coupled to the second radio, a third port, and a fourth port coupled to an impedance matched load, wherein the RF front-end circuit is configured to:
      receive an incident wave at the first port having a first phase;
      cause a first reflected wave at the third port to have a second phase that is 90-degrees from the first phase; and
      output a second reflected wave, at the second port, that has a third phase that is 180-degrees from the first phase of the incident wave, canceling a copy of the incident wave that is present at the second port caused by the incident wave received at the first port.

16. The device of claim 15, wherein the RF front-end circuit further comprises:
   a directional coupler; and
   a phase-shifter circuit that causes the first reflected wave at the third port to have the second phase.

17. The device of claim 16, wherein the phase-shifter circuit comprises a digital phase shifter.

18. The device of claim 16, wherein the directional coupler and the phase-shifter circuit are integrated in a single integrated circuit.

19. The device of claim 15, wherein the RF front-end circuit comprises a control input that receives a control signal, wherein the control signal adjusts a first phase shift amount applied to the first reflected wave to a second phase shift amount applied to the first reflected wave such that the second reflected wave, at the second port, has the third phase that is 180-degrees from the first phase of the incident wave.

20. The device of claim 15, further comprising a processor coupled to the first radio and the second radio, wherein the processor is to send a control signal to RF front-end circuit, wherein the control signal adjusts a first phase shift amount applied to the first reflected wave to a second phase shift amount such that the second reflected wave, at the second port, has the third phase that is 180-degrees from the first phase of the incident wave.

* * * * *